United States Patent
Lin

(10) Patent No.: US 9,984,987 B2
(45) Date of Patent: May 29, 2018

(54) SEMICONDUCTOR STRUCTURE AND MANUFACTURING METHOD THEREOF

(71) Applicant: NANYA TECHNOLOGY CORPORATION, Taoyuan (TW)

(72) Inventor: Po Chun Lin, Changhua (TW)

(73) Assignee: NANYA TECHNOLOGY CORPORATION, Taoyuan (TW)

( * ) Notice: Subject to any disclaimer, the term of this patent is extended or adjusted under 35 U.S.C. 154(b) by 0 days. days.

(21) Appl. No.: 15/229,882

(22) Filed: Aug. 5, 2016

(65) Prior Publication Data

US 2018/0040575 A1    Feb. 8, 2018

(51) Int. Cl.
    *H01L 23/00*    (2006.01)

(52) U.S. Cl.
    CPC .............. *H01L 24/05* (2013.01); *H01L 24/03* (2013.01); *H01L 24/13* (2013.01); *H01L 2224/0233* (2013.01); *H01L 2224/02311* (2013.01)

(58) Field of Classification Search
    CPC ......... H01L 24/03; H01L 24/05; H01L 24/13; H01L 2224/0233; H01L 2224/0235; H01L 2224/0237; H01L 2224/02373; H01L 2224/023; H01L 2224/05008; H01L 2224/05011
    See application file for complete search history.

(56) References Cited

U.S. PATENT DOCUMENTS

| | | |
|---|---|---|
| 4,042,954 A | 8/1977 | Harris |
| 4,051,508 A | 9/1977 | Sato et al. |
| 5,134,460 A | 7/1992 | Brady et al. |
| 5,404,045 A * | 4/1995 | Mizushima ............. H01L 24/05 257/698 |
| 5,656,858 A | 8/1997 | Kondo et al. |
| 5,686,762 A * | 11/1997 | Langley ................ H01L 24/05 257/775 |
| 5,986,346 A | 11/1999 | Katoh |
| 6,103,552 A * | 8/2000 | Lin ........................ H01L 24/03 257/E21.508 |
| 6,297,563 B1 | 10/2001 | Yamaha |
| 6,307,160 B1 | 10/2001 | Mei et al. |
| 6,335,561 B2 | 1/2002 | Imoto |
| 6,415,974 B2 | 7/2002 | Jao |

(Continued)

FOREIGN PATENT DOCUMENTS

| | | |
|---|---|---|
| CN | 1759480 A | 4/2006 |
| CN | 100565857 C | 12/2009 |

(Continued)

*Primary Examiner* — Earl Taylor
(74) *Attorney, Agent, or Firm* — Muncy, Geissler, Olds & Lowe, P.C.

(57) ABSTRACT

A semiconductor structure includes a substrate having a first surface and a second surface opposite to the first surface; a pad disposed over the first surface; a first passivation disposed over the first surface and partially covering the pad; a redistribution layer (RDL) disposed over the first passivation, and including a conductive line extending over the first passivation and a second passivation partially covering the conductive line. The conductive line includes a via portion coupled with the pad and extended within the first passivation towards the pad, and a land portion extended over the first passivation, wherein the land portion includes a plurality of first protrusions protruded away from the first passivation.

11 Claims, 20 Drawing Sheets

(56) References Cited

U.S. PATENT DOCUMENTS

| | | |
|---|---|---|
| 6,468,892 B1 | 10/2002 | Baker et al. |
| 6,489,229 B1 | 12/2002 | Sheridan et al. |
| 6,552,433 B1 | 4/2003 | Chou et al. |
| 6,566,762 B1 | 5/2003 | Baker et al. |
| 6,596,628 B2 | 7/2003 | Magara |
| 6,670,222 B1 | 12/2003 | Brodsky |
| 6,717,263 B2 * | 4/2004 | Sawai .................. H01L 23/3171 257/737 |
| 6,841,872 B1 * | 1/2005 | Ha ....................... H01L 23/3114 257/698 |
| 6,875,682 B1 | 4/2005 | Liu et al. |
| 7,129,111 B2 | 10/2006 | Tsai |
| 7,233,067 B2 * | 6/2007 | Takano ............. H01L 21/32134 257/737 |
| 7,271,497 B2 | 9/2007 | Joshi et al. |
| 7,358,608 B2 * | 4/2008 | Ohsumi ............. H01L 23/3114 257/737 |
| 7,682,959 B2 | 3/2010 | Lin et al. |
| 7,863,740 B2 * | 1/2011 | Ke ..................... H01L 24/13 257/737 |
| 7,932,171 B2 | 4/2011 | Joshi et al. |
| 7,977,789 B2 * | 7/2011 | Park ..................... H01L 24/03 257/737 |
| 8,253,248 B2 | 8/2012 | Ke et al. |
| 8,304,904 B2 | 11/2012 | Lin et al. |
| 8,354,750 B2 | 1/2013 | Wang et al. |
| 8,434,041 B2 | 4/2013 | Chen et al. |
| 8,476,764 B2 | 7/2013 | Huang et al. |
| 8,637,986 B2 * | 1/2014 | Masuda .................. H01L 24/03 257/738 |
| 8,642,462 B2 | 2/2014 | Sterrett et al. |
| 8,643,150 B1 | 2/2014 | Xu et al. |
| 8,901,736 B2 | 12/2014 | Shen et al. |
| 8,906,798 B2 | 12/2014 | Wang et al. |
| 9,184,144 B2 * | 11/2015 | Bao ........................ H01L 24/05 |
| 9,245,833 B2 * | 1/2016 | Chen .................. H01L 23/3185 |
| 9,362,243 B2 * | 6/2016 | Yu ......................... H01L 24/05 |
| 9,548,282 B2 * | 1/2017 | Lin ........................ H01L 24/13 |
| 9,761,549 B2 * | 9/2017 | Lin ........................ H01L 24/11 |
| 9,793,243 B2 * | 10/2017 | Lu ...................... H01L 25/0657 |
| 2001/0011761 A1 | 8/2001 | Imoto |
| 2002/0137304 A1 | 9/2002 | Yih et al. |
| 2004/0178481 A1 | 9/2004 | Joshi et al. |
| 2004/0238955 A1 | 12/2004 | Homma et al. |
| 2005/0017375 A1 | 1/2005 | Ko et al. |
| 2005/0173806 A1 | 8/2005 | Matsubara |
| 2006/0043156 A1 | 3/2006 | Debelius et al. |
| 2006/0055032 A1 | 3/2006 | Chang et al. |
| 2007/0015312 A1 | 1/2007 | Tsai |
| 2007/0020906 A1 * | 1/2007 | Chiu .................... H01L 24/03 438/597 |
| 2007/0108619 A1 | 5/2007 | Hsu |
| 2007/0207608 A1 * | 9/2007 | Wang .................. H01L 24/05 438/614 |
| 2009/0127695 A1 * | 5/2009 | Kim .................. H01L 23/49811 257/697 |
| 2009/0160052 A1 | 6/2009 | Yang et al. |
| 2009/0174052 A1 | 7/2009 | Sogawa et al. |
| 2010/0013082 A1 * | 1/2010 | Lin ....................... H01L 21/568 257/692 |
| 2010/0270672 A1 | 10/2010 | Shiraki |
| 2011/0186987 A1 | 8/2011 | Wang et al. |
| 2011/0291262 A1 | 12/2011 | Shen et al. |
| 2012/0205812 A1 * | 8/2012 | Sutardja ................. H01L 24/05 257/773 |
| 2013/0015575 A1 | 1/2013 | Lin et al. |
| 2013/0020711 A1 * | 1/2013 | Bao ........................ H01L 24/05 257/773 |
| 2013/0069235 A1 | 3/2013 | Huang et al. |
| 2013/0109169 A1 | 5/2013 | Wang et al. |
| 2013/0140691 A1 * | 6/2013 | Bao ..................... H01L 23/3114 257/737 |
| 2013/0277833 A1 | 10/2013 | Baek et al. |
| 2014/0203430 A1 | 7/2014 | Sterrett et al. |
| 2014/0312512 A1 | 10/2014 | Choi |
| 2015/0021758 A1 * | 1/2015 | Tsai ....................... H01L 24/13 257/737 |
| 2015/0037936 A1 | 2/2015 | Shen et al. |
| 2015/0340329 A1 * | 11/2015 | Yu ......................... H01L 24/05 257/773 |

FOREIGN PATENT DOCUMENTS

| | | |
|---|---|---|
| CN | 102263067 A | 11/2011 |
| CN | 102339770 B | 12/2012 |
| EP | 2023384 A | 2/2009 |
| TW | 200536030 A | 11/2005 |
| TW | 201332073 A | 8/2013 |
| TW | 201539656 A | 10/2015 |

\* cited by examiner

SEMICONDUCTOR STRUCTURE AND MANUFACTURING METHOD THEREOF

TECHNICAL FIELD

The present invention relates to a semiconductor structure including a conductive line in a redistribution layer (RDL). Several protrusions are disposed over at least a portion of the conductive line and are configured to interface with a connector disposed over the conductive line or a passivation surrounding the conductive line.

DISCUSSION OF THE BACKGROUND

Semiconductor devices are essential for many modern applications. With the advancement of electronic technology, semiconductor devices are becoming increasingly smaller in size while having greater functionality and greater amounts of integrated circuitry. Due to the miniaturized scale of semiconductor devices, wafer level chip scale packaging (WLCSP) is widely used for manufacturing. Numerous manufacturing steps are implemented within such small semiconductor devices.

However, the manufacturing of semiconductor devices in a miniaturized scale is becoming more complicated. An increase in the complexity of manufacturing semiconductor devices may cause deficiencies, such as poor electrical interconnection, development of cracks or delamination of components. As such, there are many challenges for modifying the structure and manufacturing of semiconductor devices.

This "Discussion of the Background" section is provided for background information only. The statements in this "Discussion of the Background" are not an admission that the subject matter disclosed in this "Discussion of the Background" section constitutes prior art to the present disclosure, and no part of this "Discussion of the Background" section may be used as an admission that any part of this application, including this "Discussion of the Background" section, constitutes prior art to the present disclosure.

SUMMARY

One aspect of the present disclosure provides a semiconductor structure comprising a substrate including a first surface and a second surface opposite to the first surface; a pad disposed over the first surface; a first passivation disposed over the first surface and partially covering the pad; and a redistribution layer (RDL) disposed over the first passivation and the pad, and including a conductive line extending over the first passivation and a second passivation partially covering the conductive line, wherein the conductive line includes a via portion coupled with the pad and extended within the first passivation towards the pad, and a land portion extended over the first passivation, the land portion includes a plurality of first protrusions protruded away from the first passivation.

In some embodiments, the plurality of first protrusions are exposed from the second passivation.

In some embodiments, the semiconductor structure further includes a conductive member disposed between the substrate and the land portion of the conductive line.

In some embodiments, the land portion includes a plurality of second protrusions protruded towards the substrate and surrounded by the first passivation.

In some embodiments, the plurality of first protrusions are disposed over the plurality of second protrusions respectively.

In some embodiments, the plurality of first protrusions are vertically aligned with the plurality of second protrusions respectively.

In some embodiments, the plurality of first protrusions are interposed between the plurality of second protrusions respectively.

In some embodiments, the semiconductor structure further includes a connector disposed over the land portion.

In some embodiments, the connector is interfaced with the plurality of first protrusions.

In some embodiments, the plurality of first protrusions are protruded into the connector.

In some embodiments, the plurality of first protrusions are surrounded by the second passivation.

Another aspect of the present disclosure provides a method of manufacturing a semiconductor structure which includes providing a substrate; disposing a pad over the substrate; disposing a first passivation over the substrate to partially cover the pad; disposing a conductive material over the first passivation and the pad to form a conductive line electrically connected to the pad; disposing a second passivation over the first passivation to partially cover the conductive line; and forming a plurality of first protrusions over the conductive line exposed from the second passivation.

In some embodiments, the plurality of first protrusions are formed by etching, laser ablation, drilling or electroplating.

In some embodiments, the method further includes disposing a patterned mask including a plurality of openings over the conductive line; disposing the conductive material within the plurality of openings to form the plurality of first protrusions; and removing the patterned mask.

In some embodiments, the method further includes disposing a patterned mask including a plurality of openings over the first passivation; removing portions of the first passivation exposed from the patterned mask to form a plurality of recesses over the first passivation; removing the patterned mask; and disposing the conductive material within the plurality of recesses to form a plurality of second protrusions protruded from the conductive line towards the substrate.

In some embodiments, the method further includes disposing a connector over the conductive line exposed from the second passivation and surrounding the plurality of first protrusions.

In some embodiments, the conductive material is disposed by electroplating or sputtering.

In some embodiments, the method further includes disposing a conductive member over the substrate.

Another aspect of the present disclosure provides a semiconductor structure comprising a substrate including a conductive via; a first passivation disposed over the substrate and exposing a portion of the conductive via; a conductive line disposed over the first passivation and electrically connected to the conductive via; and a second passivation disposed over the conductive line and exposing a portion of the conductive line, wherein the portion of the conductive line exposed from the second passivation includes a plurality of first protrusions protruded away from the first passivation.

In some embodiments, the conductive line includes a plurality of second protrusions protruded towards the substrate and surrounded by the first passivation.

The foregoing has outlined rather broadly the features and technical advantages of the present disclosure in order that the detailed description of the disclosure that follows may be better understood. Additional features and advantages of the disclosure will be described hereinafter, which form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures.

DETAILED DESCRIPTION

Figure 1:
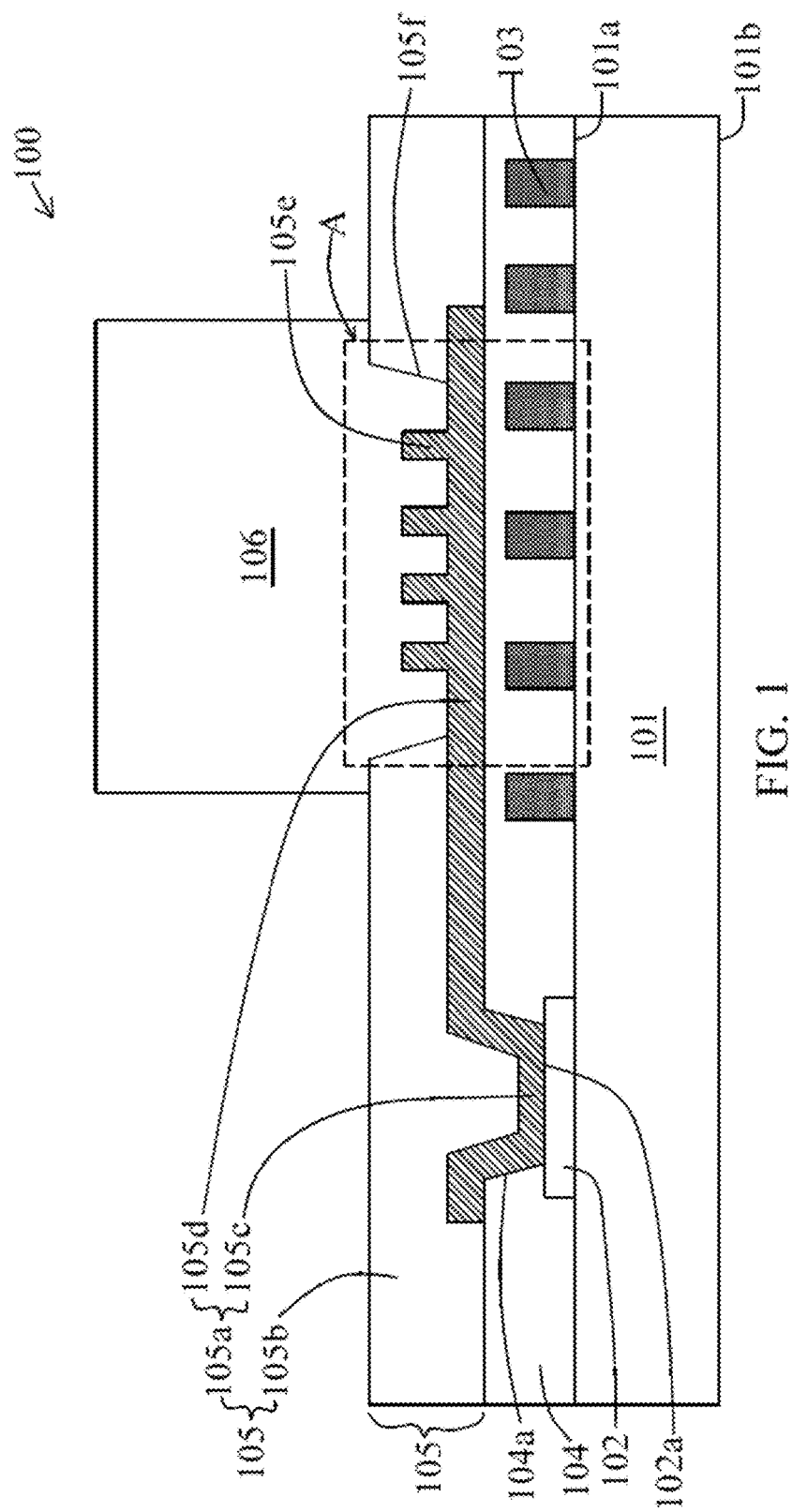
FIG. 1 is a schematic cross-sectional view of a semiconductor structure in accordance with some embodiments of the present disclosure.

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. Indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor structure including a conductive line in a redistribution layer (RDL). At least a portion of the conductive line comprises several protrusions protruded from the conductive line for improving an adhesion between the conductive line and other components of the semiconductor structure (for example, a connector, a passivation or the like) or relieving a stress over the semiconductor structure. In order to make the present disclosure completely comprehensible, detailed steps and structures are provided in the following description. Obviously, implementation of the present disclosure does not limit special details known by persons skilled in the art. In addition, known structures and steps are not described in detail, so as not to limit the present disclosure unnecessarily. Preferred embodiments of the present disclosure will be described below in detail. However, in addition to the detailed description, the present disclosure may also be widely implemented in other embodiments. The scope of the present disclosure is not limited to the detailed description, and is defined by the claims.

A semiconductor structure includes several components stacking over and interfaced with each other. For example, a connector (such as a bump, a pillar, a post or the like) is disposed over and coupled with a portion of a conductive line, or the conductive line is disposed over a passivation. Since components include different kinds of materials, an adhesion between components may not be sufficient. Therefore, delamination of components or poor electrical connection between components may occur. Furthermore, upon disposing the connector over the conductive line, a stress or a force is acted over the conductive line and may cause damage to the connector and the conductive line as well as components under the conductive line. As such, cracks may be developed in the connector or the conductive line. The cracks may even propagate into the components under the conductive line.

In the present disclosure, a semiconductor structure is disclosed. The semiconductor structure includes a conductive line in a redistribution layer (RDL). The conductive line is surrounded by a passivation. The conductive line includes a land portion for receiving a connector. The land portion includes several protrusions protruded from the conductive line. The protrusions are configured to improve an adhesion between the conductive line and the connector or between the conductive line and the passivation. The protrusions are also configured to relieve a stress over the conductive line, internal to the semiconductor structure or developed during manufacturing. As such, delamination of components of the semiconductor structure and cracks developing in the semiconductor structure can be minimized or prevented. Thus, the reliability of the semiconductor structure can be improved.

FIG. 1 is a cross-sectional view of a semiconductor structure 100 in accordance with some embodiments of the present disclosure. In some embodiments, the semiconductor structure 100 includes a substrate 101, a pad 102, one or more conductive members 103, a first passivation 104, a redistribution layer (RDL) 105 and a connector 106. In some embodiments, the semiconductor structure 100 is a part of a die, a chip or a semiconductor package.

In some embodiments, the substrate 101 is fabricated with a predetermined functional circuit thereon. In some embodiments, the substrate 101 includes several conductive traces and several electrical components, such as transistors and diodes, connected by the conductive traces. In some embodiments, the substrate 101 is a semiconductive substrate. In some embodiments, the substrate 101 is a wafer. In some embodiments, the substrate 101 includes semiconductive material such as silicon, germanium, gallium, arsenic, and combinations thereof. In some embodiments, the substrate 101 is a silicon substrate. In some embodiments, the substrate 101 is in a quadrilateral, rectangular, square, polygonal or any other suitable shapes.

In some embodiments, the substrate 101 includes a first surface 101a and a second surface 101b opposite to the first surface 101b. In some embodiments, the first surface 101a is a front side or an active side where the circuits or electrical components are disposed thereon. In some embodiments, the second surface 101b is a back side or an inactive side.

In some embodiments, the pad 102 is disposed over the substrate 101. In some embodiments, the pad 102 is disposed over or within the first surface 101a of the substrate 101. In some embodiments, the pad 102 is electrically connected to a circuitry or an electrical component in the substrate 101. In some embodiments, the pad 102 is electrically connected with a circuitry external to the substrate 101 so that the circuitry in the substrate 101 can electrically connect to the circuitry external to the substrate 101 through the pad 102. In some embodiments, the pad 102 is configured to receive a conductive structure. In some embodiments, the pad 102 is a die pad or a bond pad. In some embodiments, the pad 102 includes gold, silver, copper, nickel, tungsten, aluminum, palladium and/or alloys thereof.

In some embodiments, the passivation 104 is disposed over the substrate 101 and a periphery of the pad 102. In some embodiments, the passivation 104 partially covers the pad 102; as such, a portion 102a of the pad 102 is exposed from the passivation 104. In some embodiments, the passivation 104 surrounds the pad 102. In some embodiments, the passivation 104 is configured to provide an electrical insulation and a moisture protection for the substrate 101 so that the substrate 101 is isolated from an ambient environment.

In some embodiments, one or more conductive members 103 are disposed over the substrate 101. In some embodiments, the conductive members 103 are disposed over the first surface 101a of the substrate 101. In some embodiments, the conductive members 103 are electrically connected to the circuitry or electrical components in the substrate 101. In some embodiments, the conductive members 103 are extended over the substrate 101. In some embodiments, the conductive member 103 is adjacent to the pad 102. In some embodiments, the conductive members 103 are adjacent to each other. In some embodiments, the conductive members 103 are arranged parallel to each other. In some embodiments, the conductive members 103 are spaced from each other at a consistent distance (pitch).

In some embodiments, the conductive member 103 is a conductive trace, metallic line, conductive pad, conductive pillar, conductive layer or the like. In some embodiments, the conductive member 103 includes copper, gold, silver, nickel, solder, tin, lead, tungsten, aluminum, titanium, palladium and/or alloys thereof.

In some embodiments, the first passivation 104 is disposed over the substrate 101. In some embodiments, the first passivation 104 is disposed over the first surface 101a of the substrate 101. In some embodiments, the first passivation 104 covers the conductive members 103 and partially covers the pad 102. In some embodiments, a portion of the pad 102 is exposed from the first passivation 104. In some embodiments, the first passivation 104 includes a first hole 104a disposed over the pad 102 and exposing the portion of the pad 102. In some embodiments, the portion of the pad 102 is configured to receive a conductive structure or electrically connect to a circuitry external to the substrate 101.

In some embodiments, the first passivation 104 includes a single layer of dielectric material or several layers of dielectric material stacking over each other. In some embodiments, the first passivation 104 is formed with dielectric materials, such as silicon oxide, silicon oxynitride, silicon nitride, polymer, polyimide, polybenzoxazole (PBO), polyimide-iso-indroquinazalinedione (PIQ) or the like.

In some embodiments, the RDL 105 is disposed over the first passivation 104. In some embodiments, the RDL 105 includes a conductive line 105a extending over the first passivation 104 and a second passivation 105b partially covering the conductive line 105a. In some embodiments, the RDL 105 re-routes a path from the pad 102 so as to redistribute I/O terminals of the substrate 101.

In some embodiments, the conductive line 105a is disposed over or conformal to the first passivation 104. In some embodiments, the conductive line 105a electrically connects to the pad 102 or the substrate 101. In some embodiments, the conductive line 105a includes conductive material such as gold, silver, copper, nickel, tungsten, aluminum, palladium and/or alloys thereof.

In some embodiments, the conductive line 105a includes a via portion 105c coupled with the pad 102 and a land portion 105d disposed over at least one of the conductive members 103. In some embodiments, the via portion 105c is disposed over the pad 102. In some embodiments, the via portion 105c is extended within the first passivation 104 towards the pad 102. In some embodiments, the via portion 105c extends through a portion of the first passivation 104 towards the pad 102. In some embodiments, the via portion 105c is disposed over and electrically connected to the pad 102. In some embodiments, the via portion 105c is coupled with the portion of the pad 102 exposed from the first passivation 104.

In some embodiments, the land portion 105d is extended over the first passivation 104. In some embodiments, the land portion 105d is electrically connected to the pad 102 through the via portion 105c. In some embodiments, the land portion 105d is configured to receive a conductive structure or electrically connect to a circuitry external to the substrate 101 through the via portion 105c or the pad 102.

In some embodiments, the second passivation 105b is disposed over the first passivation 104. In some embodiments, the conductive line 105a is surrounded by the second passivation 105b. In some embodiments, the second passivation 105b exposes a portion of the conductive line 105a. In some embodiments, the via portion 105c is disposed within or covered by the second passivation 105b, and the land portion 105d is exposed from the second passivation 105b. In some embodiments, the second passivation 105b includes a second hole 105f disposed over the land portion 105d and exposing at least a portion of the land portion 105d In some embodiments, the second passivation 105b includes a single layer of dielectric material or several layers of dielectric material stacking over each other. In some embodiments, the second passivation 105b is formed with dielectric materials, such as silicon oxide, silicon oxynitride, silicon nitride, polymer, polyimide, polybenzoxazole (PBO), polyimide-iso-indroquinazalinedione (PIQ) or the like.

In some embodiments, the land portion 105d includes several first protrusions 105e protruded from the land portion 105d and away from the first passivation 104. In some embodiments, the first protrusions 105e stand upright over the land portion 105d. In some embodiments, the first protrusions 105e are extended orthogonal to the land portion 105d. In some embodiments, the first protrusions 105e are surrounded by the second passivation 105b. In some embodiments, the first protrusions 105e are exposed from the second passivation 105b.

In some embodiments, the first protrusion 105e is disposed above or aligned with one of the conductive members 103. In some embodiments, the first protrusion 105e is not aligned with any one of the conductive members 103. In some embodiments, the first protrusion 105e is disposed over and between two adjacent conductive members 103. In some embodiments, the first protrusions 105e are spaced from each other at a consistent or inconsistent distance. In some embodiments, the first protrusions 105e are at equal height to each other or at different heights from each other.

In some embodiments, a vertical cross section (from a view as shown in FIG. 1) of the first protrusion 105e is in a rectangular, quadrilateral or polygonal shape. In some embodiments, the vertical cross section of the first protrusion 105e is in a tapered configuration. In some embodiments, a horizontal cross section of the first protrusion 105e (from a top view of the semiconductor structure 100) is in a rectangular, quadrilateral, circular or polygonal shape.

In some embodiments, the connector 106 is disposed over the land portion 105d. In some embodiments, the connector 106 is interfaced with the first protrusions 105e. In some embodiments, the first protrusions 105e are protruded into the connector 106. In some embodiments, the first protrusions 105e are surrounded by the connector 106. In some embodiments, the connector 106 is electrically connected to the land portion 105d. In some embodiments, the connector 106 is protruded from the land portion 105d or the second passivation 105b. In some embodiments, the connector 106 is at least partially surrounded by the second passivation 105b or is at least partially disposed within the second hole 105f. In some embodiments, the connector 106 is configured to bond with a conductive structure, a chip or a package.

In some embodiments, the connector 106 is in a cylindrical, spherical or hemispherical shape. In some embodiments, the connector 106 is a solder joint, a solder bump, a solder ball, a ball grid array (BGA) ball a controlled collapse chip connection (C4) bump, a microbump or the like. In some embodiments, the connector 106 is a conductive pillar or post.

In some embodiments, the land portion 105d includes the first protrusions 105e protruded from the land portion 105d. The first protrusions 105e are configured to improve an adhesion between the land portion 105d and the connector 106, or relieve a stress over the conductive line 105a when the connector 106 is disposed over the land portion 105d. Therefore, delamination of the conductive line 105a or development of cracks within the connector 106, the conductive line 105a, the first passivation 104 or the second passivation 105b can be minimized or prevented.

Figure 2:
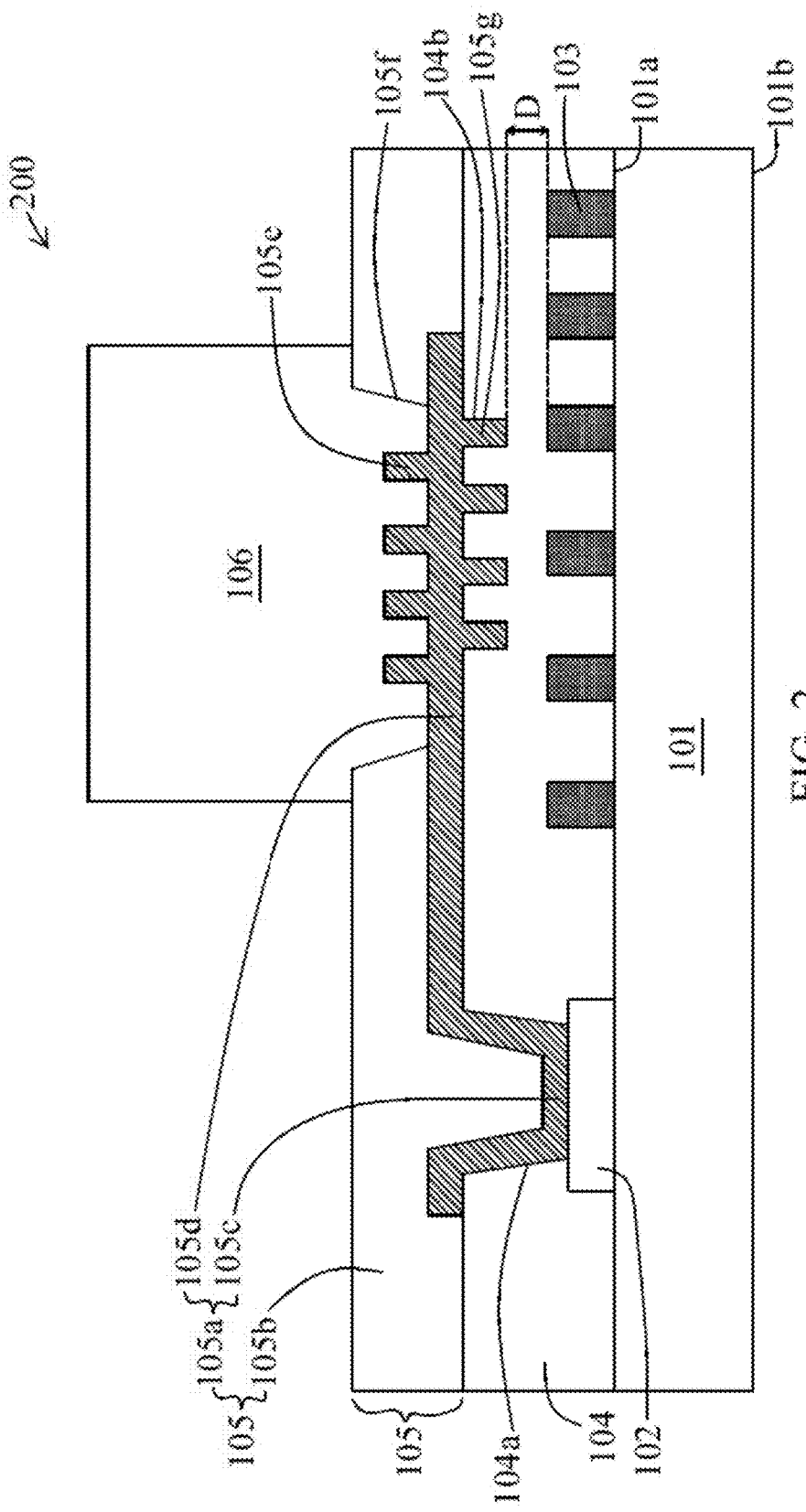
FIG. 2 is a schematic cross-sectional view of a semiconductor structure in accordance with some embodiments of the present disclosure.

FIG. 2 is a cross-sectional view of a semiconductor structure 200 comprising several second protrusions 105g. In some embodiments, the semiconductor structure 200 includes the substrate 101, the pad 102, the conductive member 103, the first passivation 104, the RDL 105 and the connector 106, which have similar configurations as described above or illustrated in FIG. 1. In some embodiments, the semiconductor structure 200 includes the second protrusions 105g protruded from the land portion 105d towards the substrate 101 or the first passivation 104.

In some embodiments, the first passivation 104 includes several recesses 104b indented into the first passivation 104 towards the substrate 101. In some embodiments, the recesses 104b are disposed over at least one of the conductive members 103.

In some embodiments, the land portion 105d includes the first protrusions 105e protruded towards the connector 106 and the second protrusions 105g protruded towards the first passivation 104. In some embodiments, the first protrusions 105e are disposed over the second protrusions 105g. In some embodiments, the land portion 105d is in a ripple or wavy shape. In some embodiments, the second protrusions 105g are protruded into the first passivation 104 from the land portion 105d towards the substrate 101 and are surrounded by the first passivation 104. In some embodiments, the second protrusions 105g are disposed within the recesses 104b, respectively. In some embodiments, the second protrusions 105g are disposed over at least one of the conductive members 103. In some embodiments, the second protrusions 105g are extended orthogonal to the land portion 105d.

In some embodiments, a vertical cross section (from a view as shown in FIG. 2) of the second protrusion 105g is in a rectangular, quadrilateral or polygonal shape. In some embodiments, the vertical cross section of the second protrusion 105g is in a tapered configuration. In some embodiments, a horizontal cross section of the first protrusion 105e (from a bottom view of the semiconductor structure 100) is in a rectangular, quadrilateral, circular or polygonal shape. In some embodiments, the second protrusions 105g are spaced from each other at a consistent or inconsistent distance. In some embodiments, the second protrusions 105g are at equal height to each other or at different heights from each other.

In some embodiments as shown in FIG. 2, the first protrusions 105e are interposed between the second protrusions 105g. In some embodiments, the first protrusion 105e is not aligned with the second protrusion 105g.

Figure 3:
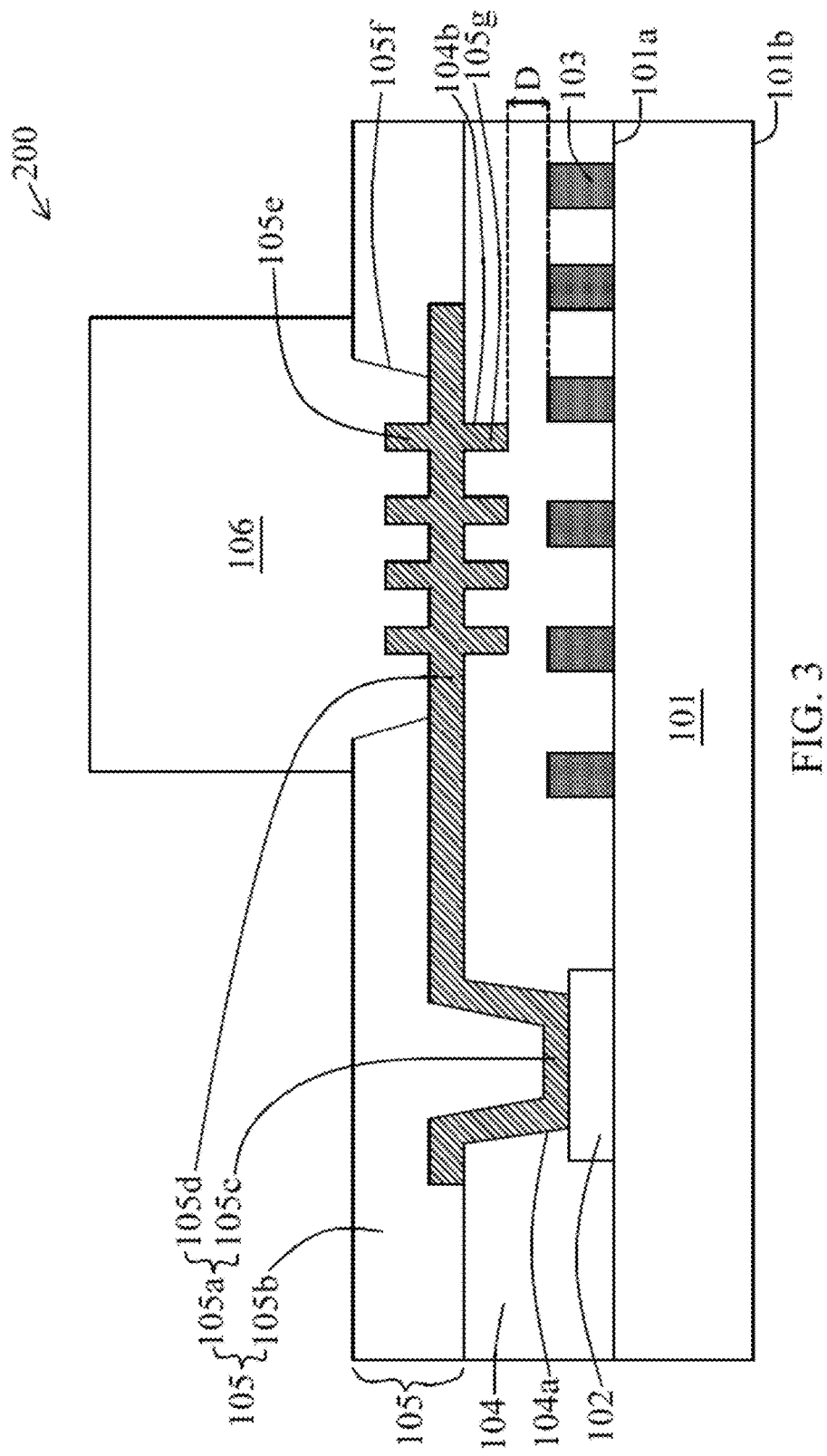
FIG. 3 is a schematic cross-sectional view of a semiconductor structure in accordance with some embodiments of the present disclosure.

In some embodiments, as shown in FIG. 3, the first protrusions 105e are vertically aligned with the second protrusions 105g, respectively. In some embodiments, the first protrusion 105e is disposed opposite to the corresponding second protrusion 105g.

Figure 4:
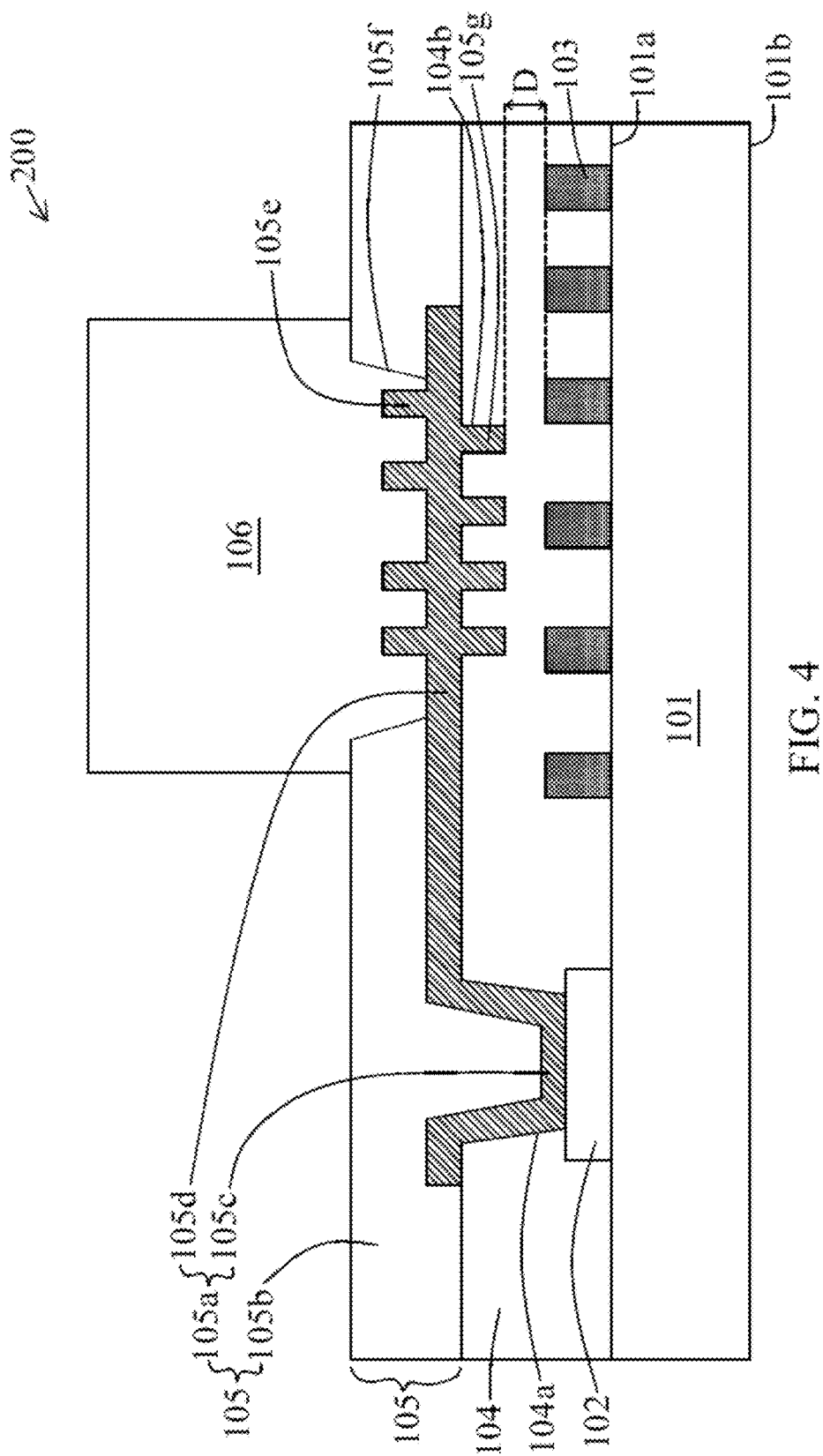
FIG. 4 is a schematic cross-sectional view of a semiconductor structure in accordance with some embodiments of the present disclosure.

In some embodiments, as shown in FIG. 4, some of the first protrusions 105e are aligned with some of the corresponding second protrusions 105g, while some of the first protrusions 105e are not aligned with some of the corresponding second protrusions 105g.

In some embodiments, the second protrusion 105g is disposed above one of the conductive members 103. In some embodiments, a distance D between the second protrusion 105g and the conductive member 103 is substantially greater than zero. In some embodiments, the distance D is substantially greater than 1 μm.

Figure 5:
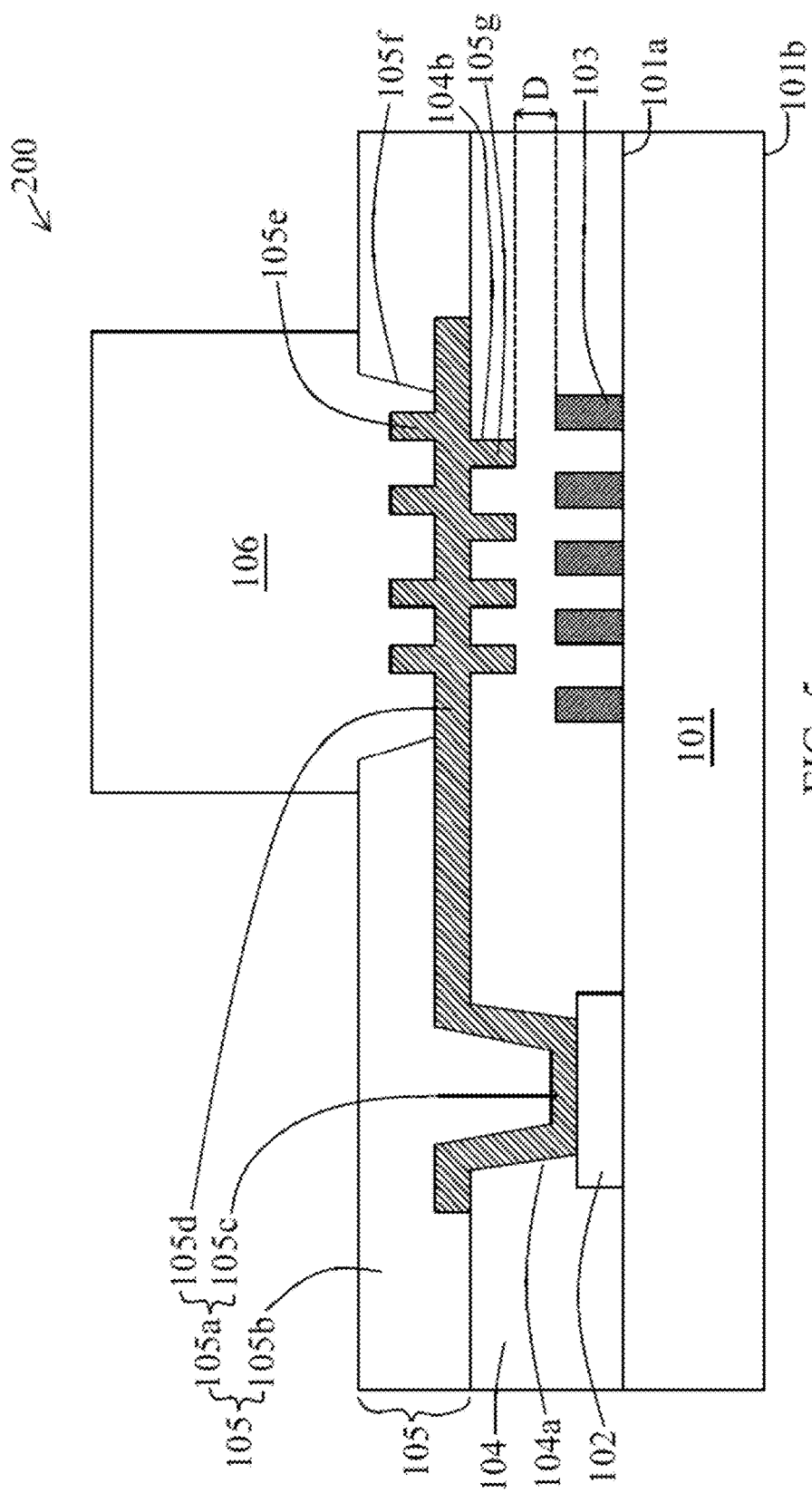
FIG. 5 is a schematic cross-sectional view of a semiconductor structure in accordance with some embodiments of the present disclosure.

In some embodiments, as shown in FIG. 5, the second protrusions 105g are not vertically aligned with the conductive members 103. In some embodiments, the second protrusion 105g is not aligned with any of the conductive members 103. In some embodiments, the second protrusion 105g is disposed above and between two adjacent conductive members 103.

Figure 6:
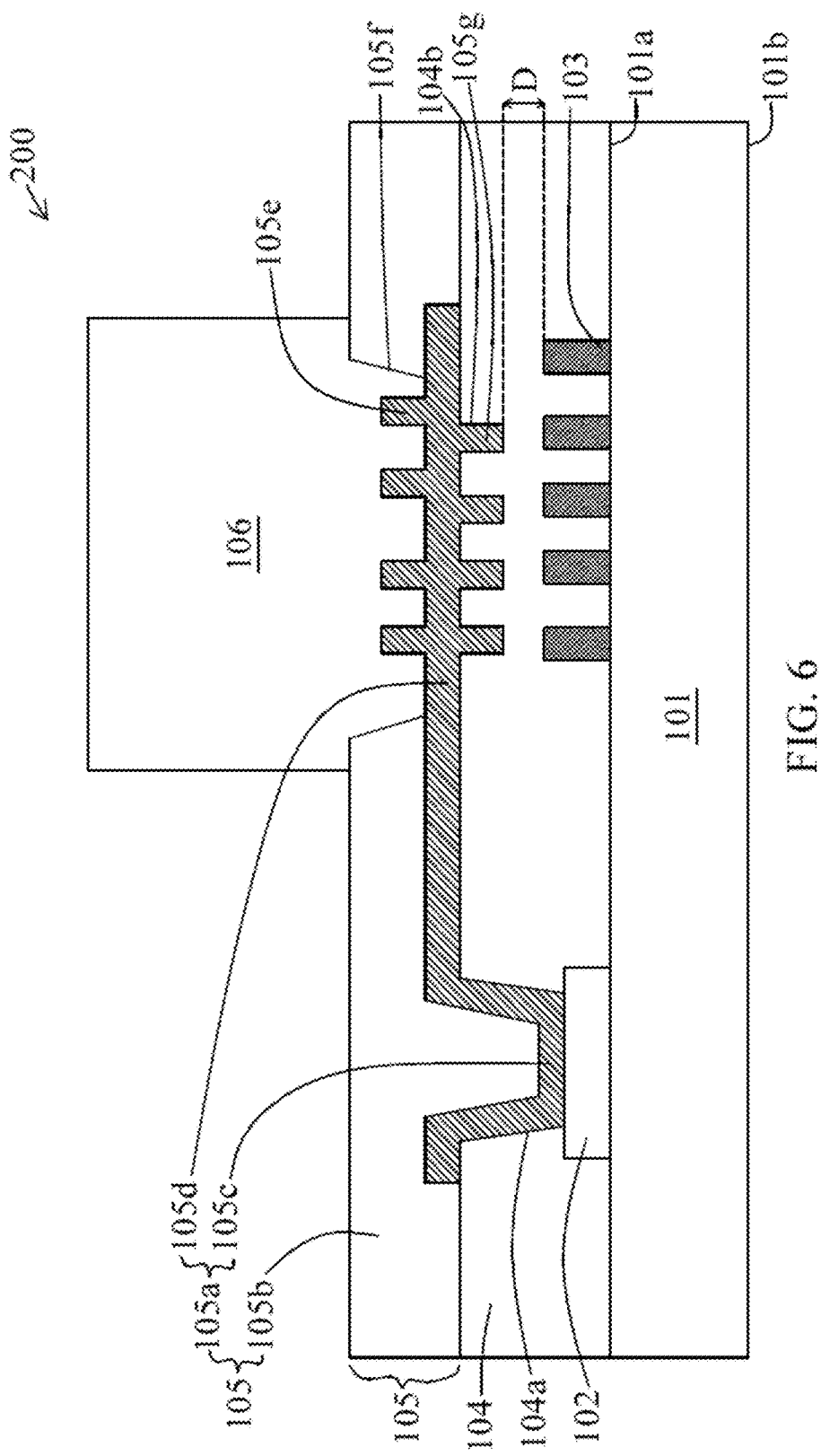
FIG. 6 is a schematic cross-sectional view of a semiconductor structure in accordance with some embodiments of the present disclosure.

In some embodiments, as shown in FIG. 6, the second protrusions 105g are vertically aligned with the conductive members 103. In some embodiments, the second protrusion 105g is aligned with one of the conductive members 103.

Figure 7:
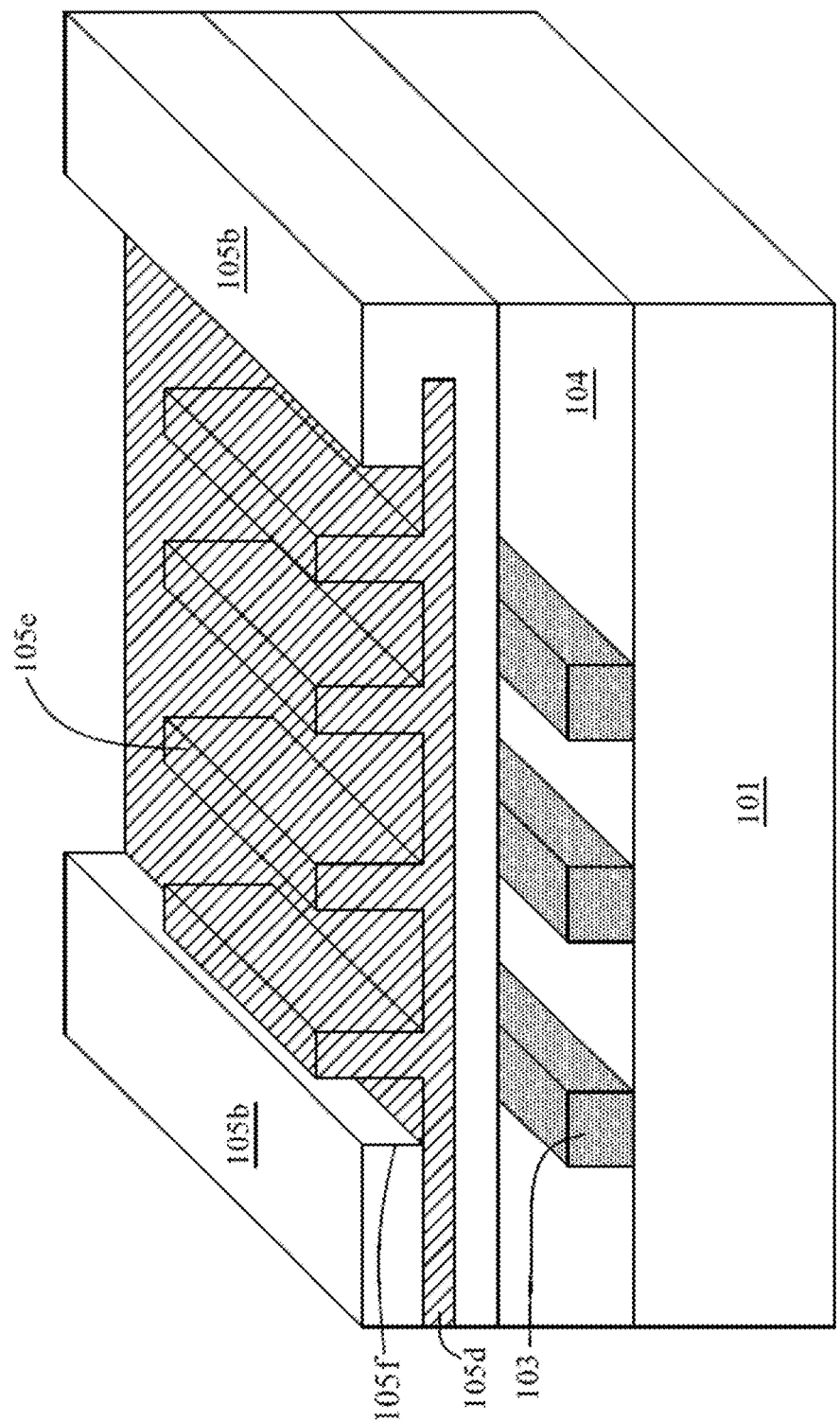
FIG. 7 is a schematic isometric cross-sectional view of a region A of a semiconductor structure of FIG. 1 in accordance with some embodiments of the present disclosure.
Figure 8:
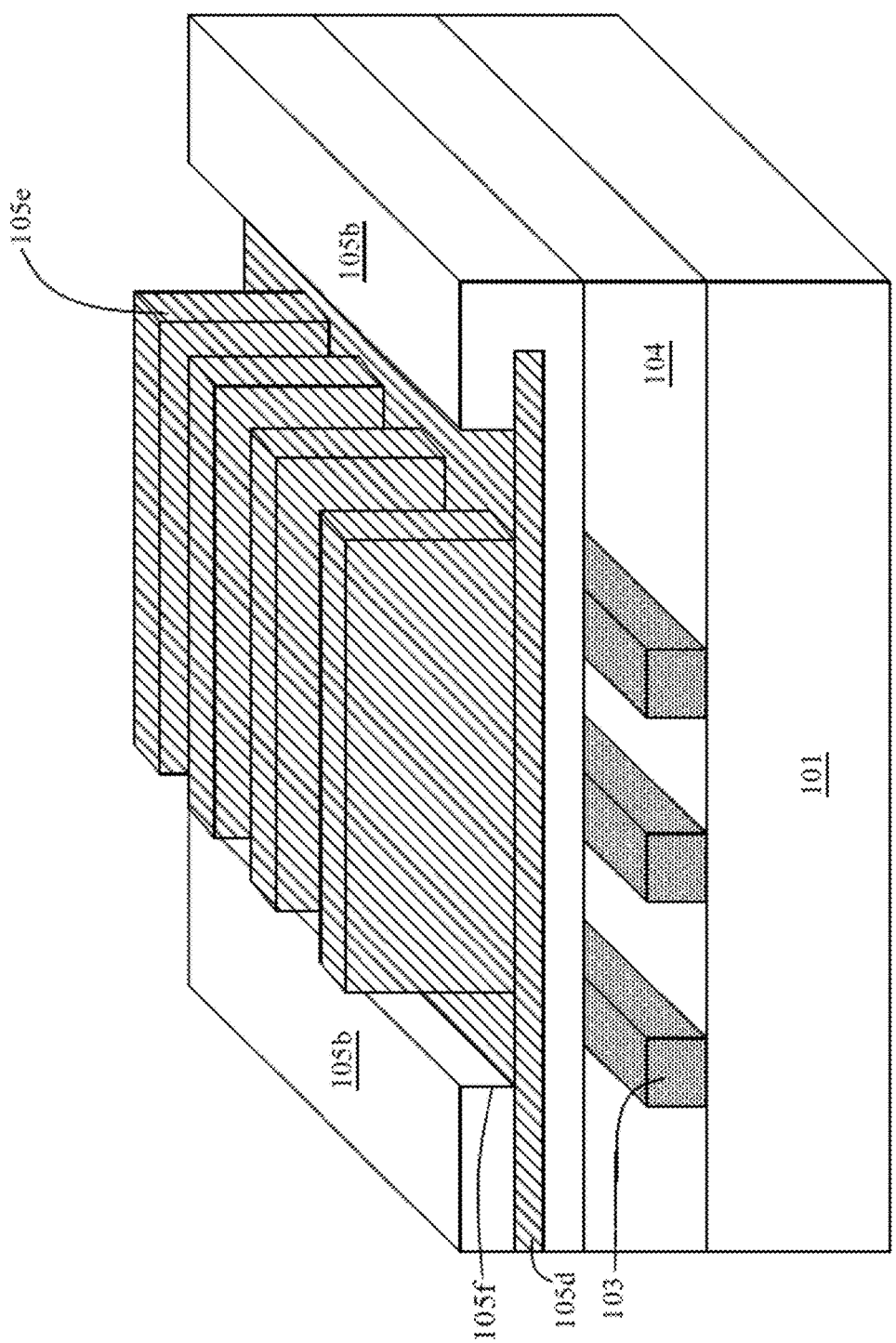
FIG. 8 is a schematic isometric cross-sectional view of a region A of a semiconductor structure of FIG. 1 in accordance with some embodiments of the present disclosure.
Figure 9:
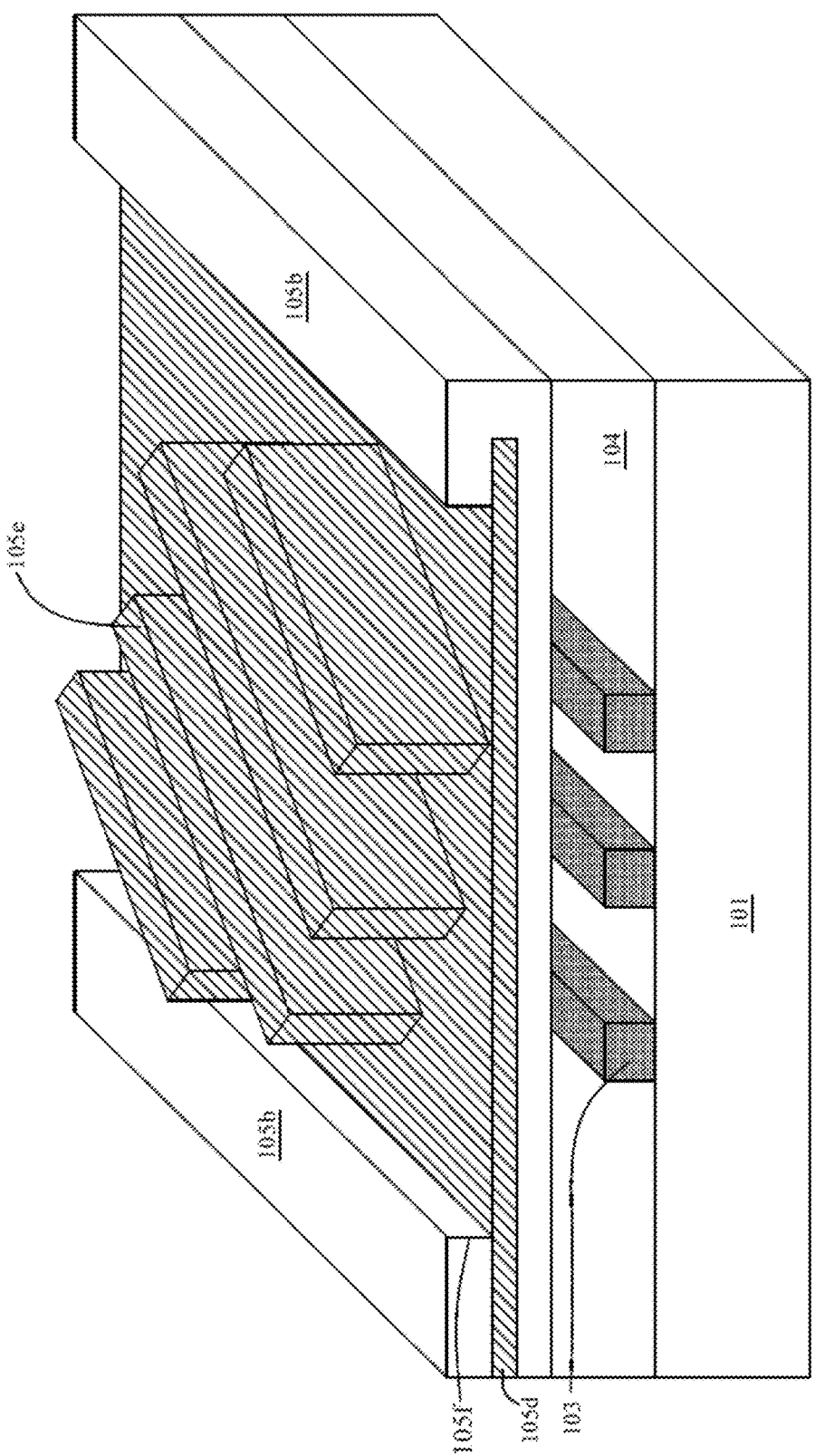
FIG. 9 is a schematic isometric cross-sectional view of a region A of a semiconductor structure of FIG. 1 in accordance with some embodiments of the present disclosure.

FIGS. 7-9 are isometric cross-sectional views of the semiconductor structure (100 or 200) in a region A of FIG. 1 illustrating the first protrusions 105e in various configurations. In some embodiments, as shown in FIG. 7, the first protrusion 105e is elongated in a direction substantially parallel to the conductive member 103. In some embodiments, as shown in FIG. 8, the first protrusion 105e is elongated in a direction substantially orthogonal to the conductive member 103. In some embodiments, as shown in FIG. 9, the first protrusion 105e is elongated in a direction with an angle relative to the conductive member 103. In some embodiments, the angle is about 1° to 89°. In some embodiments, the first protrusions 105e are elongated at the same distance or different distances. In some embodiments, the first protrusions 105e are at equal length or different lengths.

Figure 10:
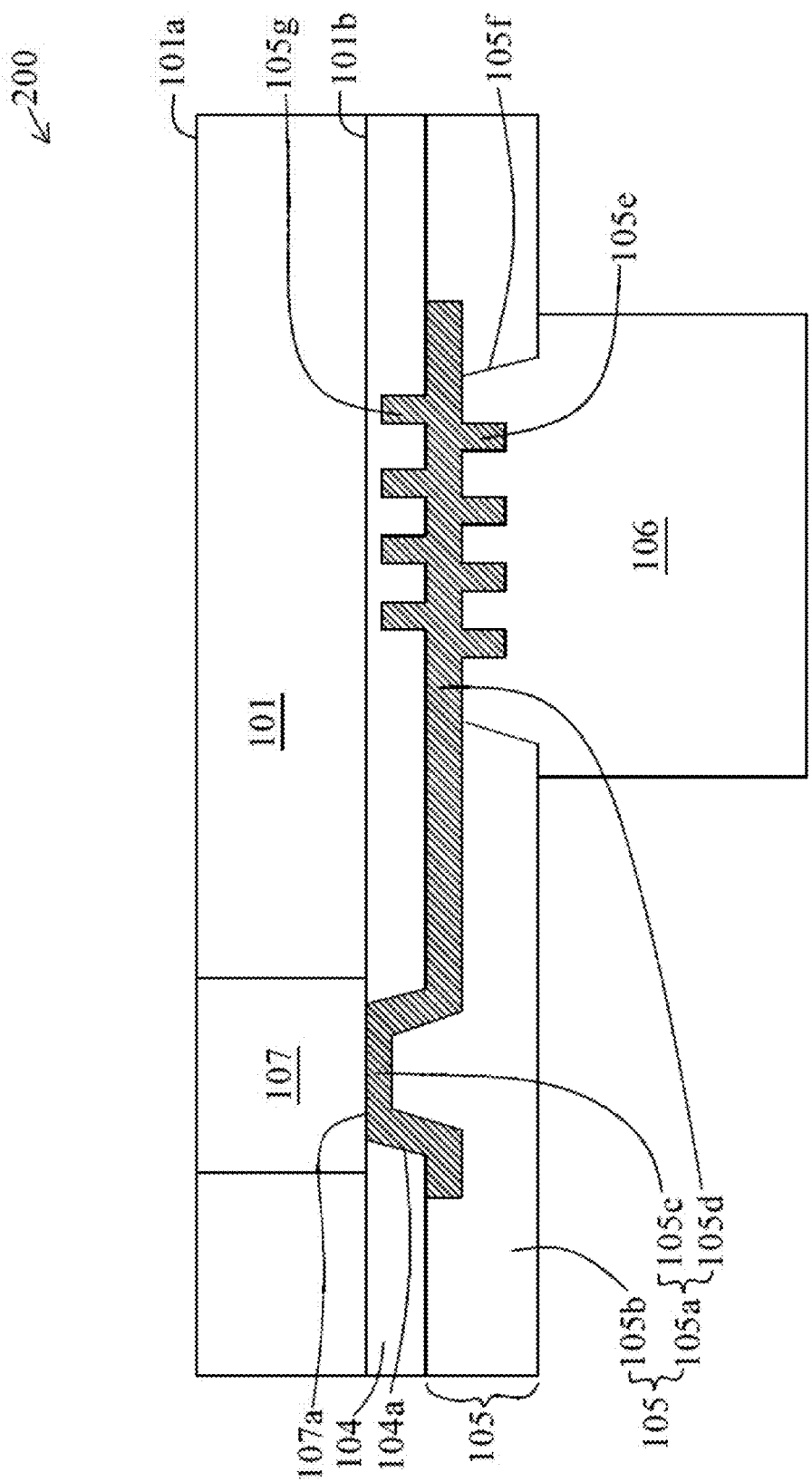
FIG. 10 is a schematic cross-sectional view of a semiconductor structure in accordance with some embodiments of the present disclosure.

FIG. 10 is a cross-sectional view of another embodiment of a semiconductor structure 200. In some embodiments, the semiconductor structure 200 includes a substrate 101, a conductive via 107, a first passivation 104, a redistribution layer (RDL) 105 and a connector 106. In some embodiments, the substrate 101, the first passivation 104, the RDL 105 and the connector 106 have similar configuration as described above or illustrated in any one of FIGS. 1-9. In some embodiments, the conductive via 107 is extended through the substrate 101. In some embodiments, the first passivation 104 is disposed over the substrate 101. In some embodiments, a portion 107a of the conductive via 107 is exposed from the first passivation 104. In some embodiments, the RDL 105 is disposed over the substrate 101. In some embodiments, the RDL 105 is disposed over the second surface 101b of the substrate 101. In some embodiments, a conductive line 105a of the RDL 105 is disposed over the first passivation 104 and electrically connected to the conductive via 107. In some embodiments, a second passivation 105b of the RDL 105 is disposed over the conductive line 105a and exposing a portion of the conductive line 105a. In some embodiments, the portion of the conductive line 105a exposed from the second passivation 105b includes several first protrusions 105e protruded away from the first passivation 104. In some embodiments, the conductive line 105a includes several second protrusions protruded towards the substrate 101 and surrounded by the first passivation 104.

Figure 11:
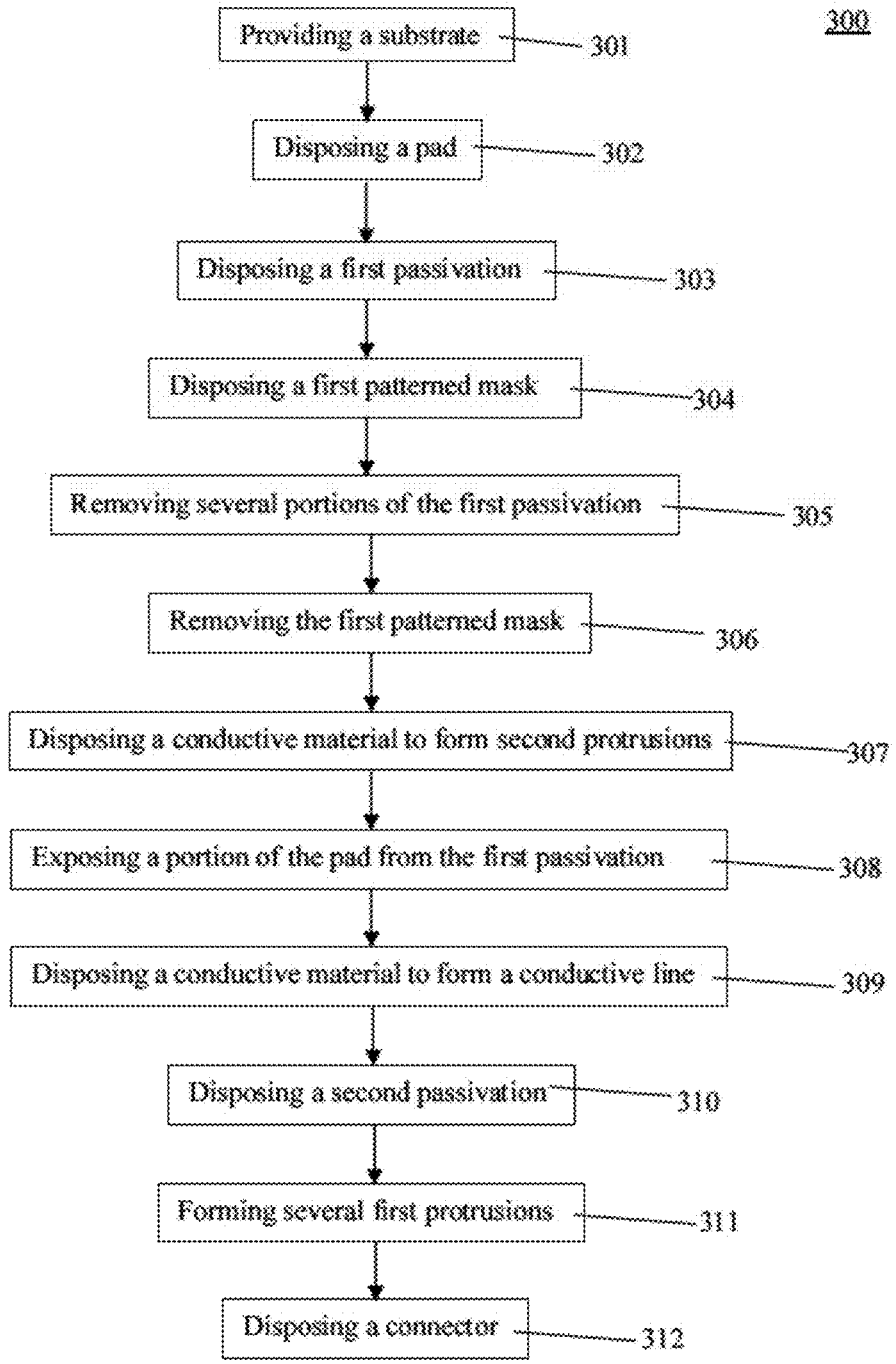
FIG. 11 is a flow chart of a method of manufacturing a semiconductor structure in accordance with some embodiments of the present disclosure.

In the present disclosure, a method of manufacturing a semiconductor structure (100 or 200) is also disclosed. In some embodiments, the semiconductor structure (100 or 200) can be formed by a method 300 of FIG. 11. The method 300 includes a number of operations and the description and illustration are not deemed as a limitation as the sequence of the operations. The method 300 includes a number of steps (301, 302, 303, 304, 305, 306, 307, 308, 309, 310, 311 and 312).

Figure 12:
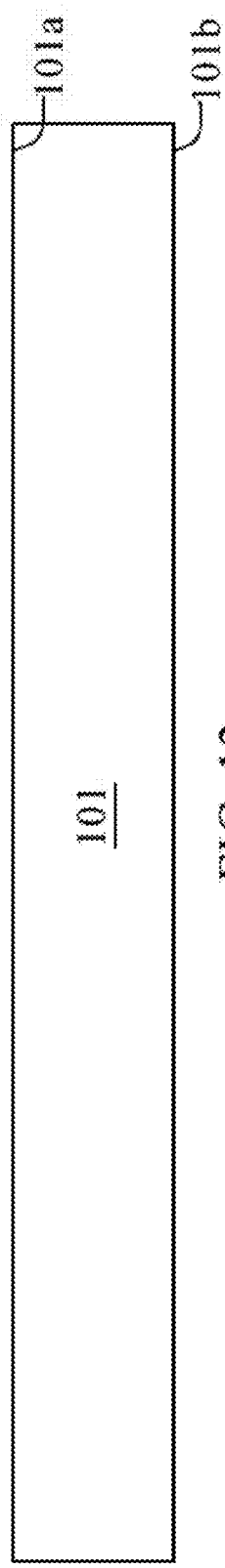
FIGS. 12-28 are schematic views of manufacturing the semiconductor structure by the method of FIG. 11 in accordance with some embodiments of the present disclosure.

In step 301, a substrate 101 is provided or received as shown in FIG. 12. In some embodiments, the substrate 101 includes a first surface 101a and a second surface 101b opposite to the first surface 101a. In some embodiments, the substrate 101 includes several conductive lines and several electrical components, such as transistors and diodes, connected by the conductive lines. In some embodiments, the substrate 101 is a semiconductive substrate. In some embodiments, the first substrate 101 includes silicon, germanium, gallium, arsenic, and combinations thereof. In some embodiments, the substrate 101 is a silicon substrate. In some embodiments, the substrate 101 includes a conductive via extending through the substrate 101. In some embodiments, the conductive via has similar configuration as the conductive via 107 described above or illustrated in FIG. 10. In some embodiments, the substrate 101 has a similar configuration as described above or illustrated in any one of FIGS. 1-10.

Figure 13:
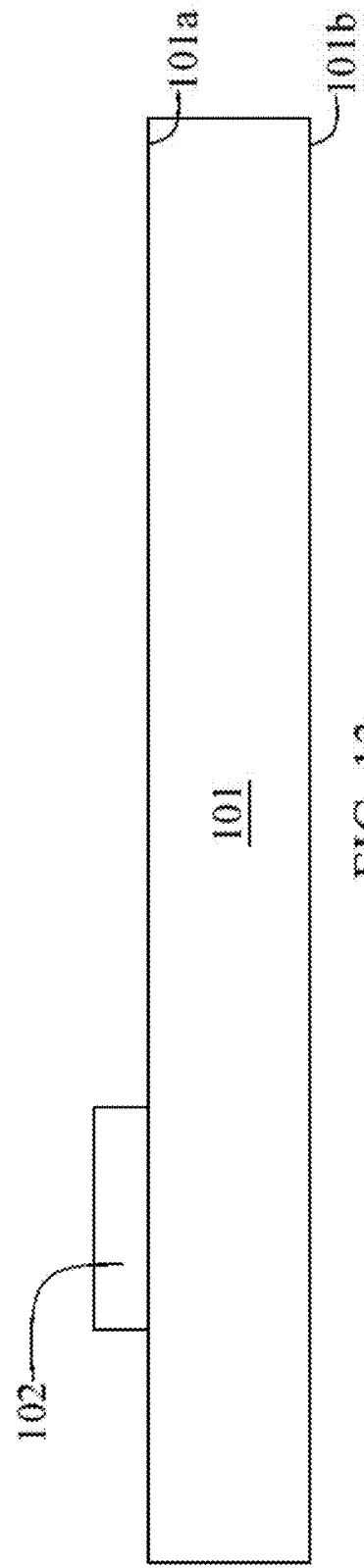

In step 302, a pad 102 is disposed over the substrate 101 as shown in FIG. 13. In some embodiments, the pad 102 is disposed over the first surface 101a of the substrate 101. In some embodiments, the pad 102 is electrically connected to a circuitry in the substrate 101. In some embodiments, the pad 102 is configured to receive a conductive structure. In some embodiments, the pad 102 is a die pad or a bond pad. In some embodiments, the pad 102 includes gold, silver, copper, nickel, tungsten, aluminum, palladium and/or alloys thereof. In some embodiments, the pad 102 is formed by electroplating or any other suitable processes. In some embodiments, the pad 102 has a similar configuration as described above or illustrated in any one of FIGS. 1-9. In some embodiments, the disposing of the pad 102 is omitted when the substrate 101 includes the conductive via extending through the substrate 101.

Figure 14:
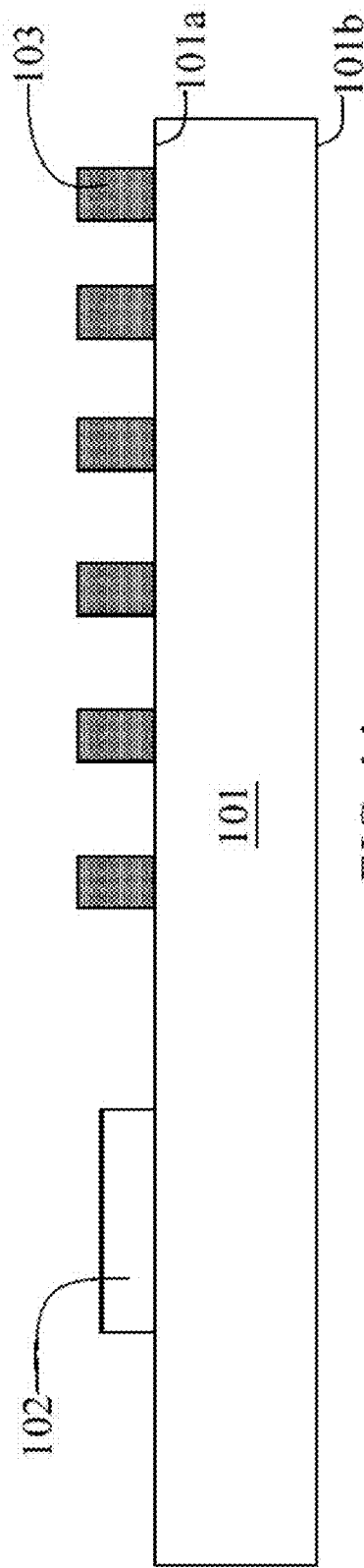

In some embodiments, several conductive members 103 are disposed over the substrate 101 as shown in FIG. 14. In some embodiments, the conductive members 103 are disposed over the first surface 101a of the substrate 101. In some embodiments, the conductive member 103 is a conductive trace, a metallic line or the like. In some embodiments, the conductive member 103 includes gold, silver, copper, nickel, tungsten, aluminum, palladium and/or alloys thereof. In some embodiments, the conductive members 103 are formed by photolithography, etching, sputtering, electroplating or any other suitable processes. In some embodiments, the conductive member 103 has a similar configuration as described above or illustrated in any one of FIGS. 1-9.

Figure 15:
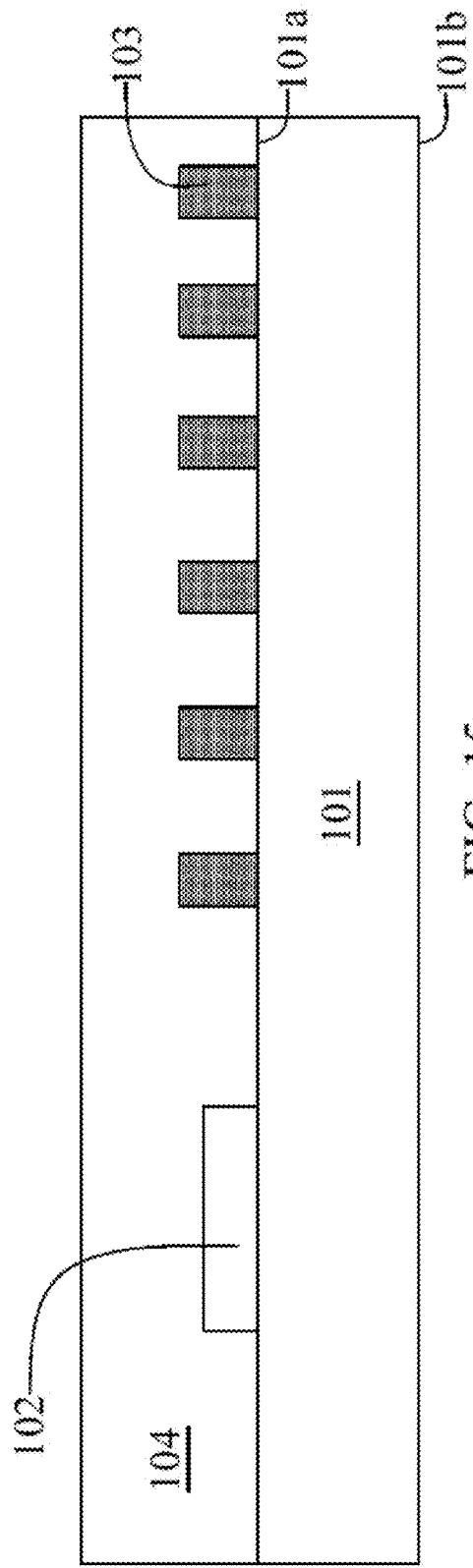

In step 303, a first passivation 104 is disposed over the substrate 101 as shown in FIG. 15. In some embodiments, the first passivation 104 covers the conductive member 103 and the pad 102. In some embodiments, the first passivation 104 is formed with dielectric materials such as silicon oxide, silicon oxynitride, silicon nitride, polymer, polyimide, PBO, PIQ or the like. In some embodiments, the first passivation 104 is disposed by chemical vapor deposition (CVD), plasma-enhanced chemical vapor deposition (PECVD), spin coating or any other suitable processes. In some embodiments, the first passivation 104 has a similar configuration as described above or illustrated in any one of FIGS. 1-10.

Figure 16:
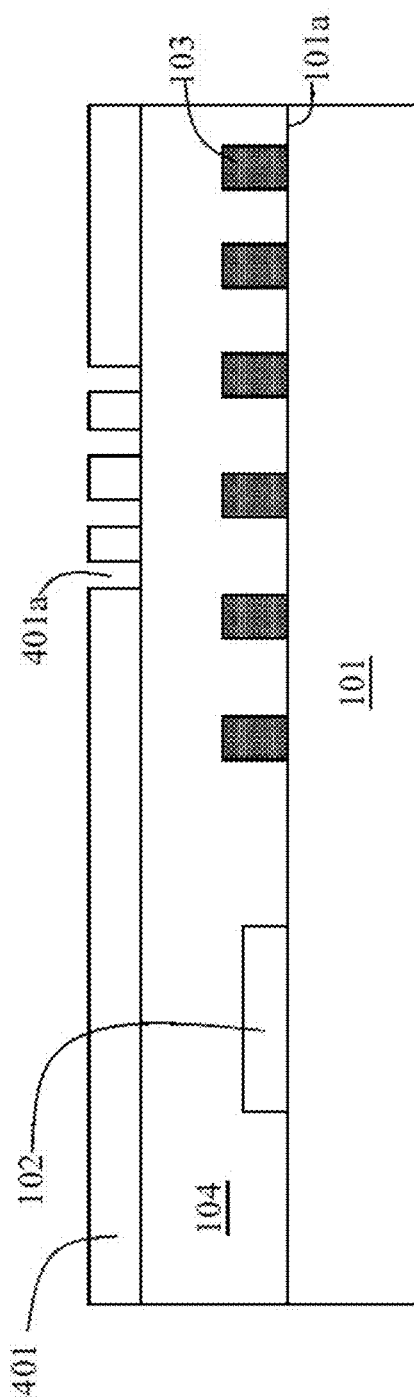

In step 304, a first patterned mask 401 is disposed over the first passivation 104 as show in FIG. 16. In some embodiments, the first patterned mask 401 is formed by disposing a photoresist (PR) over the first passivation 104 and removing some portions of the PR to form several first openings 401a. In some embodiments, the PR is disposed by deposition or any other suitable processes. In some embodiments, some portions of the PR are removed by photolithography, etching or any other suitable processes. In some embodiments, several portions of the first passivation 104 are exposed from the first patterned mask 401.

Figure 17:
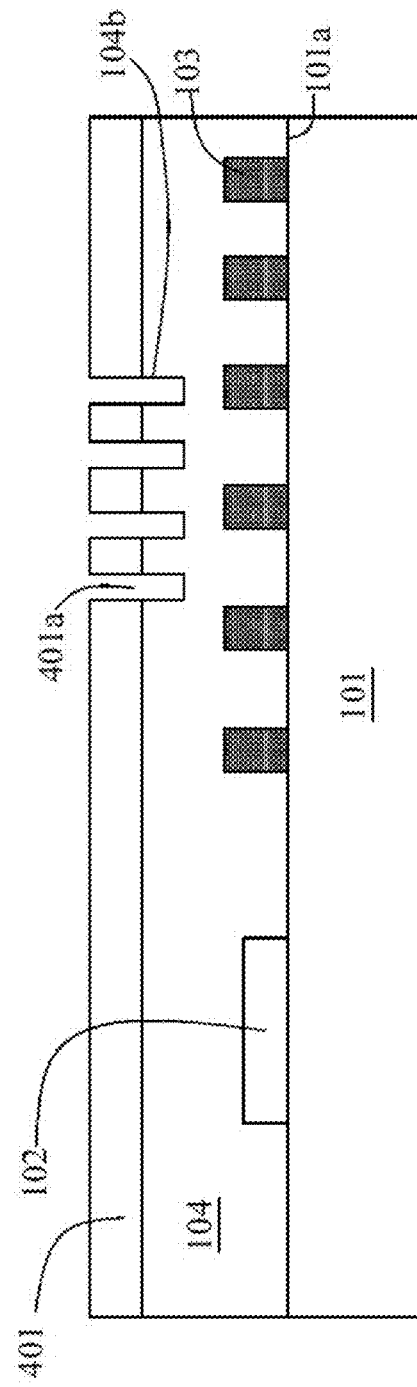

In step 305, several portions of the first passivation 104 exposed from the first patterned mask 401 are removed to form several recesses 104b over the first passivation 104 as shown in FIG. 17. In some embodiments, those portions of the first passivation 104 under the first openings 401a are removed. In some embodiments, those portions of the first passivation 104 exposed from the first patterned mask 401 are removed by etching or any other suitable processes. In some embodiments, the recesses 104b have similar configuration as described above or illustrated in any one of FIGS. 2-6.

Figure 18:
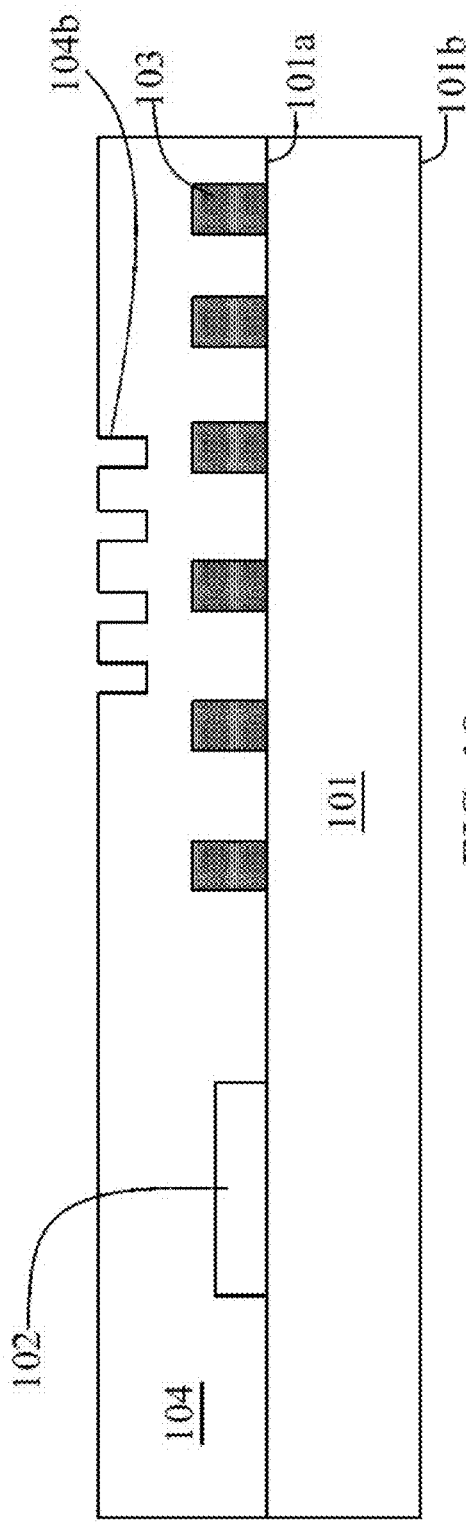

In step 306, the first patterned mask 401 is removed as shown in FIG. 18. In some embodiments, the first patterned mask 401 is removed by etching, stripping or any other suitable processes.

Figure 19:
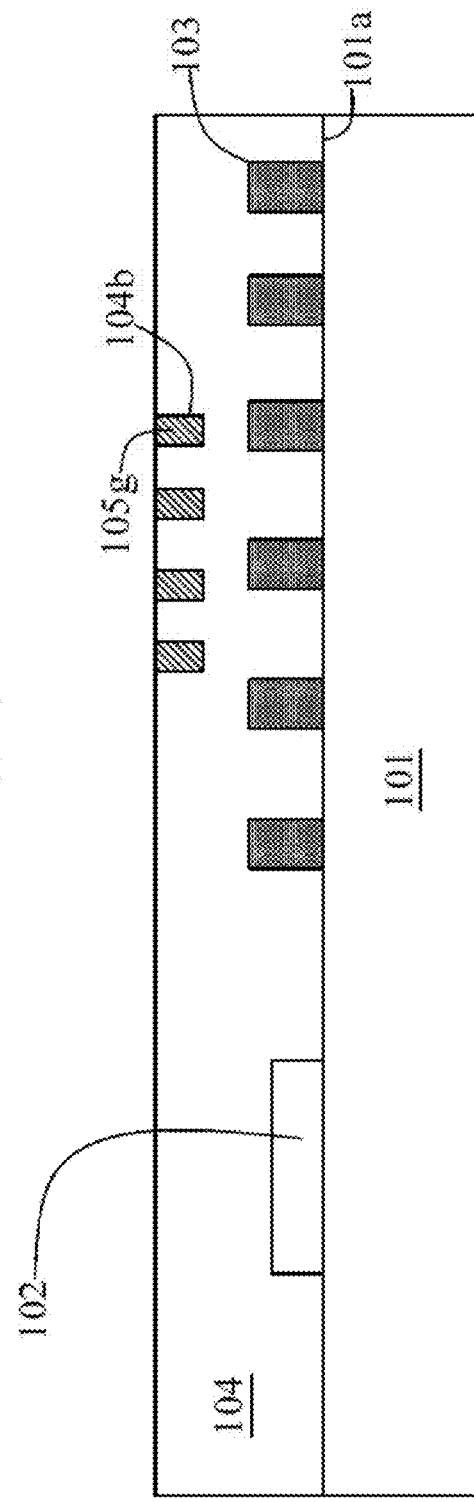

In step 307, a conductive material is disposed within the recesses 104b to form several second protrusions 105g as shown in FIG. 19. In some embodiments, the second protrusions 105g are protruded into the first passivation 104 towards the substrate 101. In some embodiments, the conductive material is disposed by metal filling, electroplating, sputtering or any other suitable processes. In some embodiments, the conductive material is disposed over the first passivation 104 and within the recesses 104b, and then the conductive material disposed over the first passivation 104 is removed by chemical mechanical polish (CMP) or any other suitable processes. In some embodiments, the conductive material includes gold, silver, copper, nickel, tungsten, aluminum, palladium and/or alloys thereof. In some embodiments, the second protrusions 105g have similar configuration as described above or illustrated in any one of FIGS. 2-6.

Figure 20:
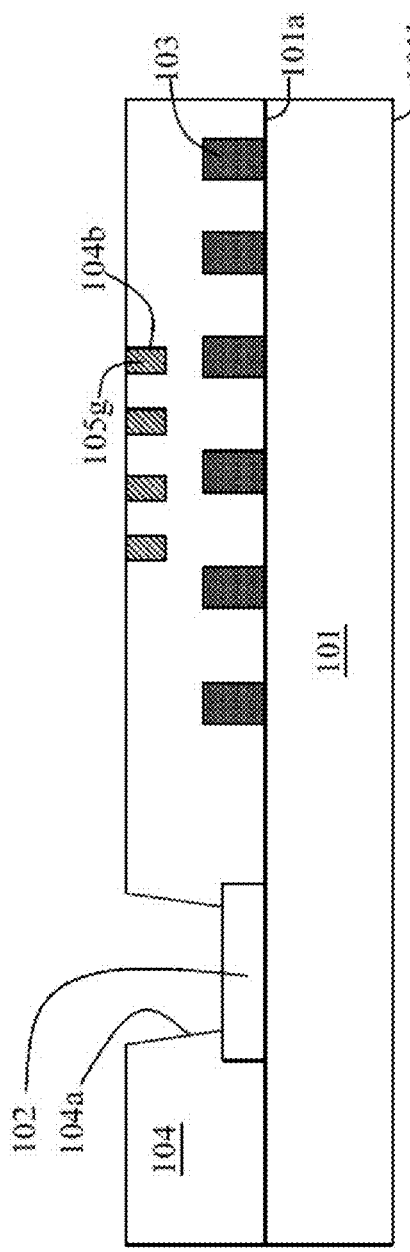

In step 308, a portion of the first passivation 104 disposed over the pad 102 is removed to form a first hole 104a and expose a portion of the pad 102 as shown in FIG. 20. In some embodiments, the first hole 104a is formed by disposing a photoresist (PR) over the first passivation 104, removing a portion of the PR and removing a portion of the first passivation 104 exposed from the PR. In some embodiments, the portion of the pad 102 exposed from the first passivation 104 is configured to receive a conductive structure. In some embodiments, the first hole 104a has a similar configuration as described above or illustrated in any one of FIGS. 1-6. In some embodiments, a portion of the conductive via of the substrate 101 is exposed from the first passivation 104 when a portion of the first passivation 104 disposed over the conductive via is removed. In some embodiments, the portion of the conductive via exposed from the first passivation 104 is configured to receive a conductive structure.

Figure 21:
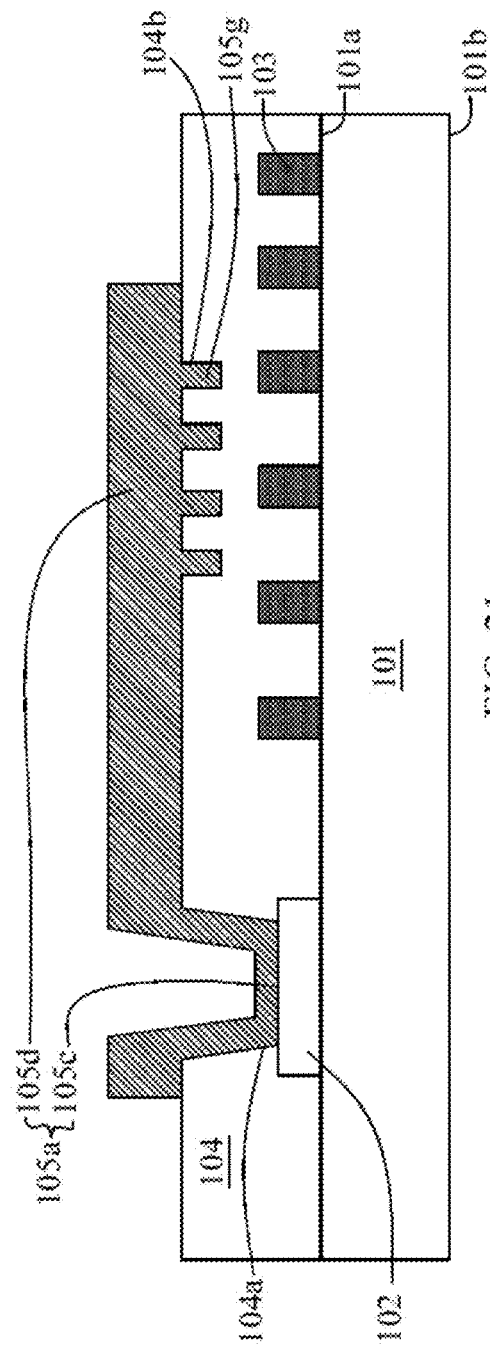

In step 309, a conductive material is disposed over the first passivation 104 and the pad 102 to form a conductive line 105a as shown in FIG. 21. In some embodiments, the conductive line 105a is electrically connected to the pad 102. In some embodiments, a conductive material is disposed over the portion of the conductive via exposed from the first passivation 104 to form a conductive line 105a electrically connected to the conductive via. In some embodiments, the conductive material is disposed by sputtering, electroplating or any other suitable processes. In some embodiments, the second protrusions 105g are protruded from the conductive line 105a towards the substrate 101. In some embodiments, the conductive material includes gold, silver, copper, nickel, tungsten, aluminum, palladium and/or alloys thereof.

Figure 22:
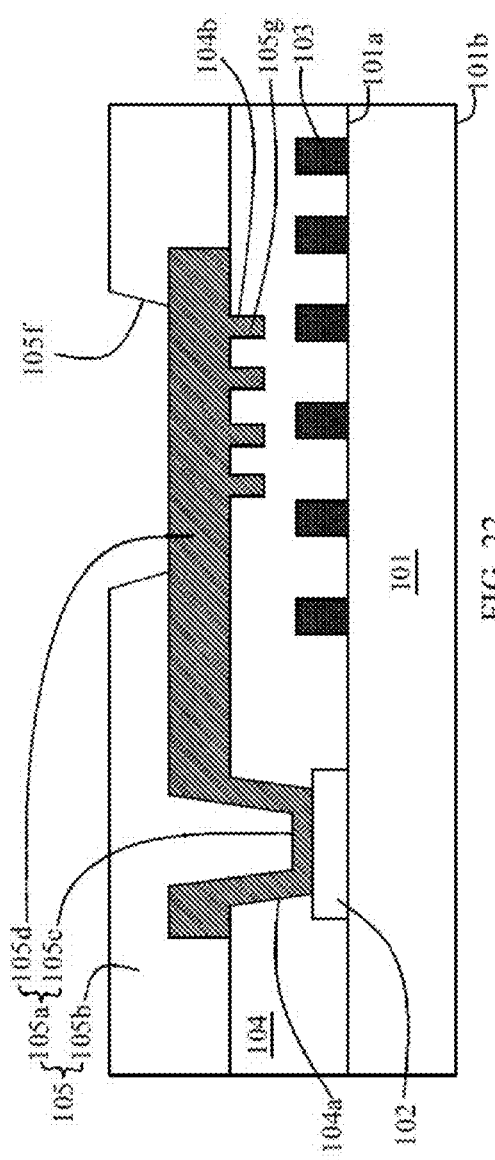

In step 310, a second passivation 105b is disposed over the first passivation 104 to partially cover the conductive line 105a as shown in FIG. 22. In some embodiments, the second passivation 105b is formed with dielectric materials such as silicon oxide, silicon oxynitride, silicon nitride, polymer, polyimide, PBO, PIQ or the like. In some embodiments, the second passivation 105b is disposed by chemical vapor deposition (CVD), plasma-enhanced chemical vapor deposition (PECVD), spin coating or any other suitable processes. In some embodiments, a portion of the second passivation 105b is removed to form a second hole 105f and to expose a land portion 105d of the conductive line 105 or a part of the land portion 105d. In some embodiments, the second hole 105f is formed by disposing a photoresist (PR) over the second passivation 105b, removing a portion of the PR and removing a portion of the second passivation 105b disposed over the land portion 105d. In some embodiments, the second passivation 105b and the second hole 105f have a similar configuration as described above or illustrated in any one of FIGS. 1-10.

In step 311, several first protrusions 105e are formed over the conductive line 105 exposed from the second passivation 105b as shown in FIGS. 23-26. In some embodiments, the first protrusions 105e have a similar configuration as described above or illustrated in any one of FIGS. 1-10.

Figure 23:
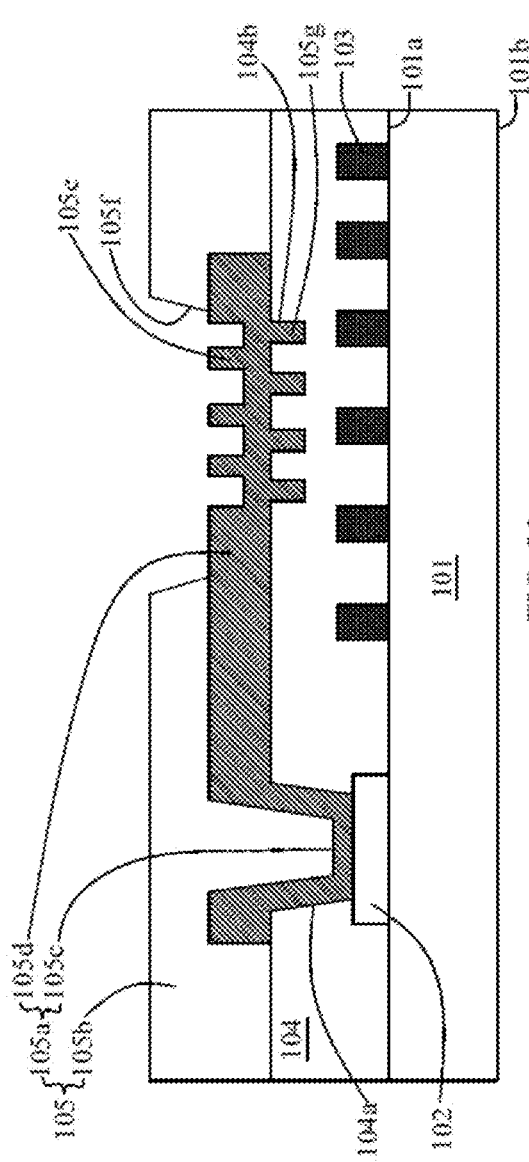

In some embodiments as shown in FIG. 23, the first protrusions 105e are formed by removing some portions of the land portion 105d of the conductive line 105 exposed from the second passivation 105b. In some embodiments, some portions of the land portion 105d are removed by etching, laser ablation, drilling or any other suitable processes.

Figure 24:
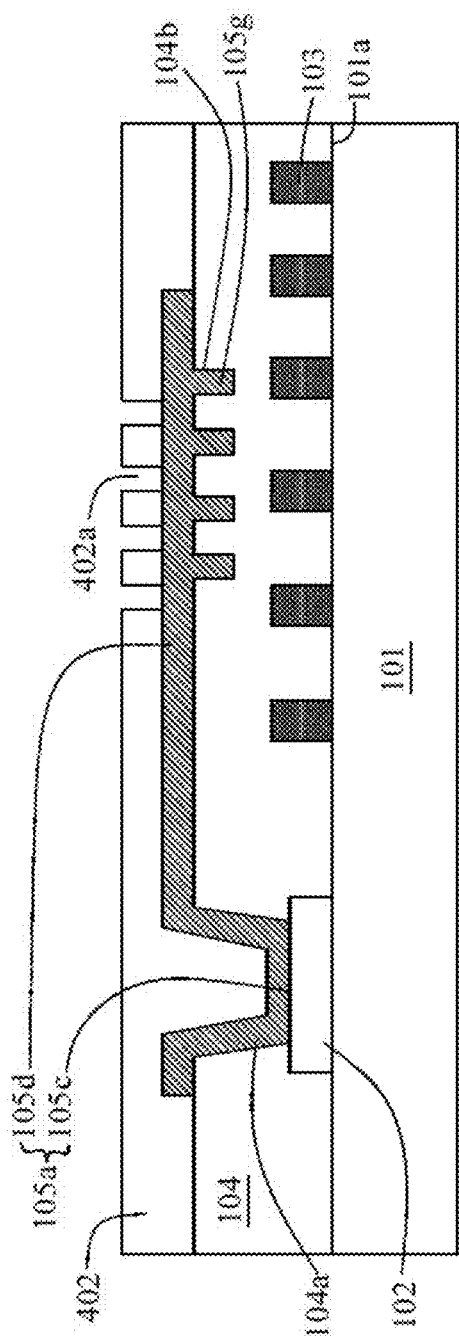
Figure 25:
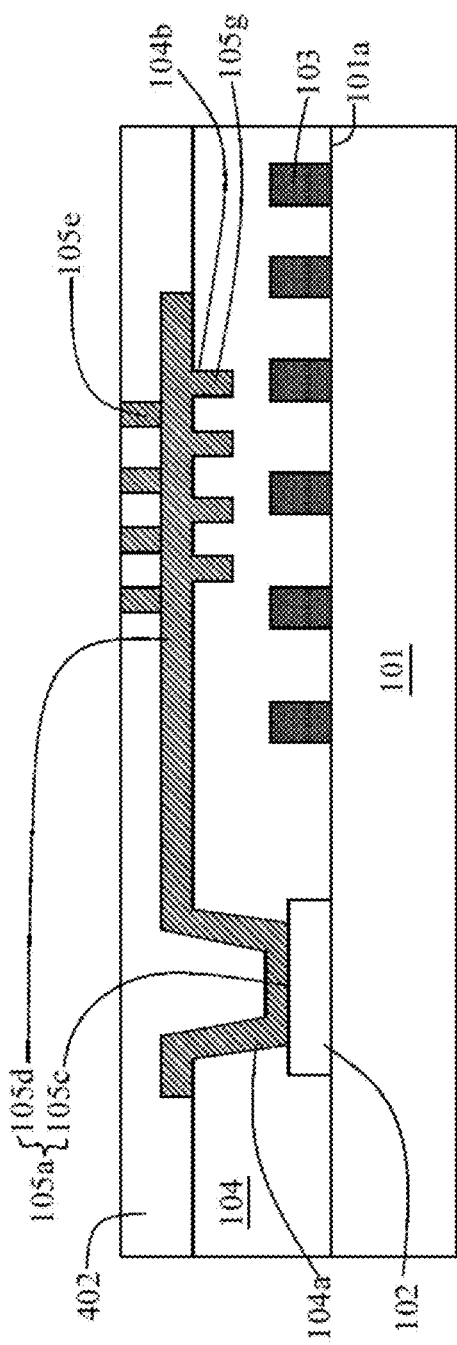
Figure 26:
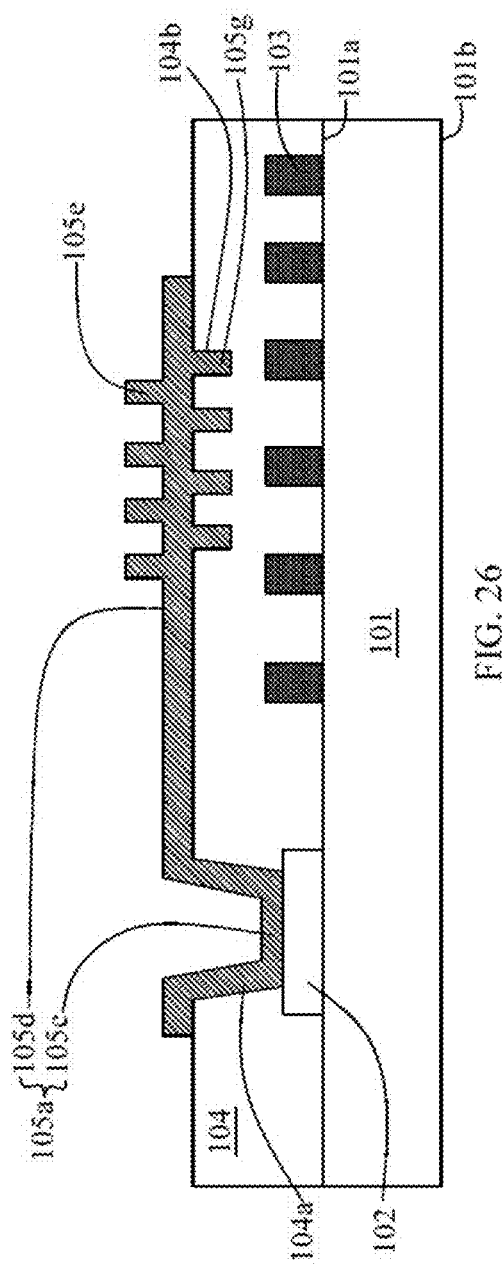

In some embodiments, the first protrusions 105e are formed before the disposing of the second passivation 105b. In some embodiments, the step 311 is performed before the step 310. In some embodiments as shown in FIGS. 24-26, the first protrusions 105e are formed by disposing the first protrusions 105e over the land portion 105d. In some embodiments, the first protrusions 105e are formed by disposing a second patterned mask 402 including several second openings 402a over the conductive line 105, as shown in FIG. 24, disposing a conductive material within the openings 402a to form the first protrusions 105e, as shown in FIG. 25, and removing the second patterned mask 402, as shown in FIG. 26. In some embodiments, the second patterned mask 402 is formed by disposing a photoresist (PR) over the first passivation 104 and removing some portions of the PR to form the second openings 402a. In some embodiments, the PR is disposed by deposition or any other suitable processes. In some embodiments, some portions of the PR are removed by photolithography, etching or any other suitable processes. In some embodiments, several portions of the land portion 105d are exposed from the second patterned mask 402. In some embodiments, the second patterned mask 402 is removed by etching, stripping or any other suitable processes.

Figure 27:
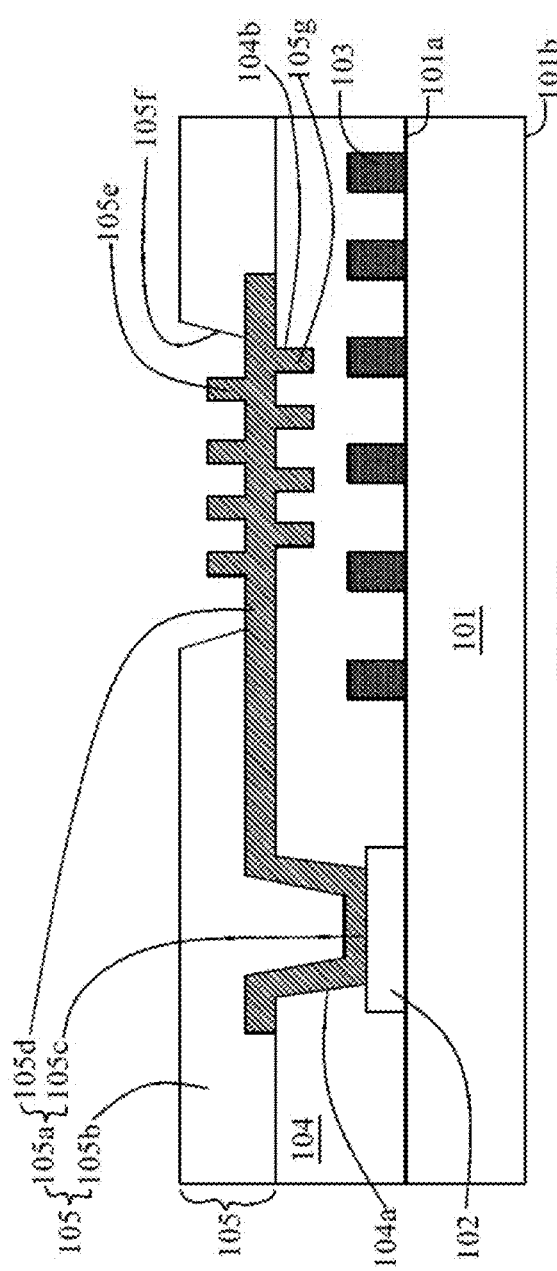

In some embodiments, the second passivation 105b is disposed over the conductive line 105 after the formation of the first protrusions 105e as shown in FIG. 27 or as the step 310 described above.

Figure 28:
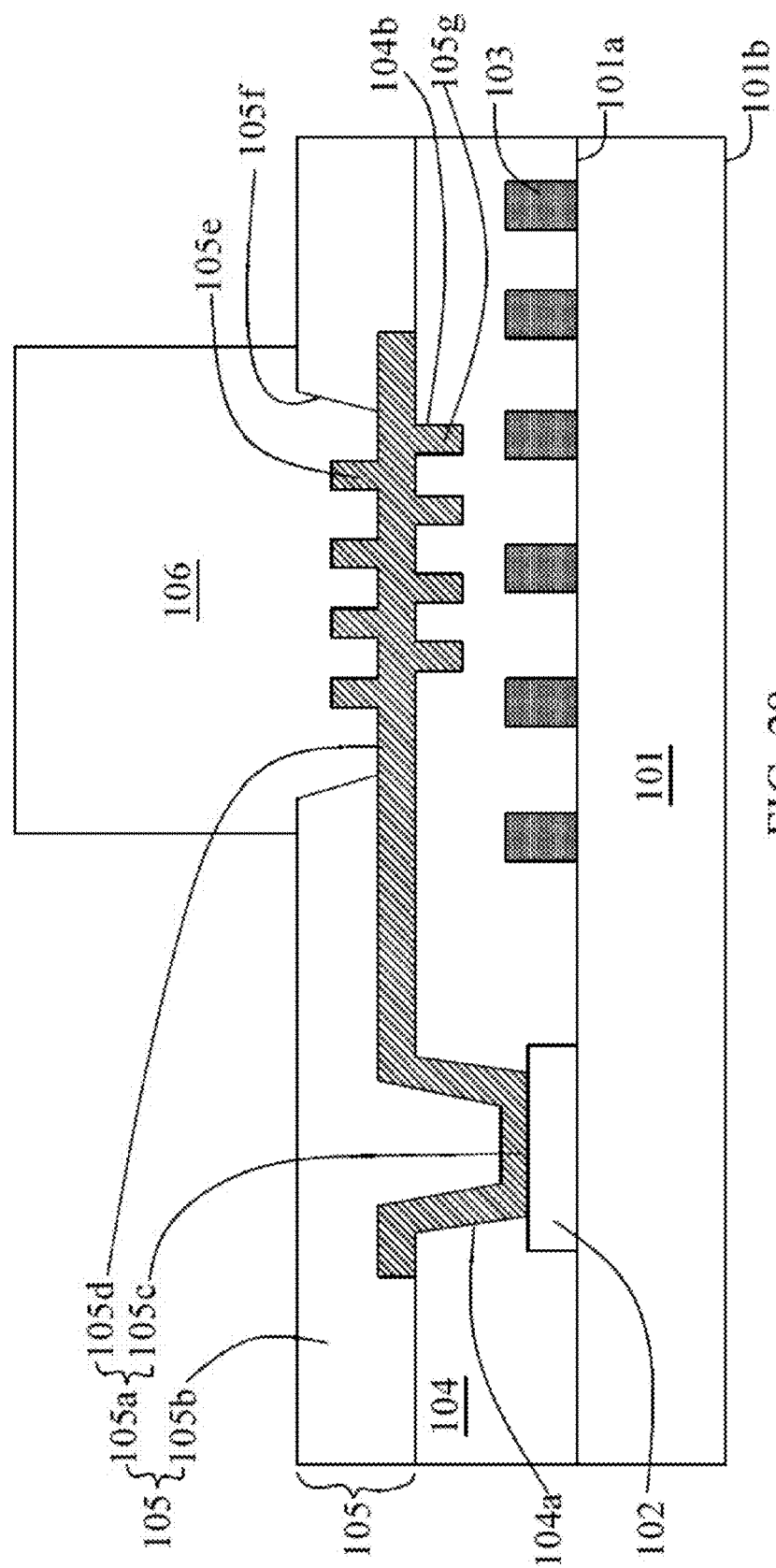

In step 312, a connector 106 is disposed over the conductive line 105 exposed from the second passivation 105b as shown in FIG. 28. In some embodiments, the connector 106 surrounds the first protrusions 105e. In some embodiments, the connector 106 is disposed over the land portion 105d and interfaced with the first protrusions 105e. In some embodiments, the connector 106 is disposed by electroplating, ball dropping, solder pasting, stencil printing or other suitable processes. In some embodiments, the connector 106 is at least partially surrounded by the second passivation 105b or is at least partially disposed within the second hole 105f. In some embodiments, the connector 106 is configured to bond with a conductive structure, a chip or a package. In some embodiments, the connector 106 has a similar configuration as described above or illustrated in any one of FIG. 1-6 or 10. In some embodiments, the semiconductor structure (100 or 200) as shown in any one of FIG. 1-6 or 10 is formed.

One aspect of the present disclosure provides a semiconductor structure including a substrate including a first surface and a second surface opposite to the first surface; a pad disposed over the first surface; a conductive member disposed over the first surface; a first passivation disposed over the first surface, covering the conductive member and partially covering the pad; and a redistribution layer (RDL) disposed over the first passivation, and including a conductive line extending over the first passivation and a second passivation partially covering the conductive line, wherein the conductive line includes a via portion coupled with the pad and extended within the first passivation towards the pad, and a land portion disposed over the conductive member, the land portion includes a plurality of first protrusions protruded away from the first passivation Another aspect of the present disclosure provides a method of manufacturing a semiconductor structure which includes providing a substrate; disposing a pad over the substrate; disposing a conductive member over the substrate; disposing a first passivation over the substrate to cover the conductive member and partially cover the pad; disposing a conductive material over the first passivation and the pad to form a conductive line electrically connected to the pad; disposing a second passivation over the first passivation to partially cover the conductive line; and forming a plurality of first protrusions over the conductive line exposed from the second passivation.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor structure, comprising:
    a substrate including a first surface and a second surface opposite to the first surface;
    a pad disposed over the first surface;
    a first passivation disposed over the first surface and partially covering the pad; and
    a redistribution layer (RDL) disposed over the first passivation, and including a conductive line extending over the first passivation and a second passivation partially covering the conductive line;
    wherein the conductive line includes a via portion coupled with the pad and extended within the first passivation towards the pad, and a land portion extended over the first passivation, the land portion includes a plurality of first protrusions protruded away from the first passivation, and
    wherein the land portion includes a plurality of second protrusions protruded towards the substrate and surrounded by the first passivation.

2. The semiconductor structure of claim 1, wherein the plurality of first protrusions are exposed from the second passivation.

3. The semiconductor structure of claim 1, further comprising a conductive member disposed between the substrate and the land portion of the conductive line.

4. The semiconductor structure of claim 1, wherein the plurality of first protrusions are disposed over the plurality of second protrusions.

5. The semiconductor structure of claim 1, wherein the plurality of first protrusions are vertically aligned with the plurality of second protrusions respectively.

6. The semiconductor structure of claim 1, wherein the plurality of first protrusions are interposed between the plurality of second protrusions respectively.

7. The semiconductor structure of claim 1, further comprising a connector disposed over the land portion.

8. The semiconductor structure of claim 7, wherein the connector is interfaced with the plurality of first protrusions.

9. The semiconductor structure of claim 7, wherein the plurality of first protrusions are protruded into the connector.

10. The semiconductor structure of claim 1, wherein the plurality of first protrusions are surrounded by the second passivation.

11. A semiconductor structure, comprising:
    a substrate including a conductive via;
    a first passivation disposed over the substrate and exposing a portion of the conductive via;
    a conductive line disposed over the first passivation and electrically connected to the conductive via; and
    a second passivation disposed over the conductive line and exposing a portion of the conductive line;
    wherein the portion of the conductive line exposed from the second passivation includes a plurality of first protrusions protruded away from the first passivation, and
    wherein the conductive line includes a plurality of second protrusions protruded towards the substrate and surrounded by the first passivation.

* * * * *